(12) United States Patent
Ozaki et al.

(10) Patent No.: US 6,967,368 B2
(45) Date of Patent: Nov. 22, 2005

(54) FERRO-ELECTRIC MEMORY DEVICE AND METHOD OF MANUFACTURING THE SAME

(75) Inventors: Toru Ozaki, Tokyo (JP); Yoshinori Kumura, Yokohama (JP); Yoshiro Shimojo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/930,803

(22) Filed: Sep. 1, 2004

(65) Prior Publication Data

US 2005/0205919 A1   Sep. 22, 2005

(30) Foreign Application Priority Data

Mar. 18, 2004 (JP) .............................. 2004-077679

(51) Int. Cl.[7] ........................ H01L 29/76; H01L 27/108
(52) U.S. Cl. ........................ 257/295; 257/296; 257/306
(58) Field of Search ................................ 257/295, 296, 257/303, 306; 438/3, 253

(56) References Cited

U.S. PATENT DOCUMENTS

| | | | |
|---|---|---|---|
| 6,188,098 B1 * | 2/2001 | Amanuma | 257/306 |
| 6,249,014 B1 | 6/2001 | Bailey | 257/295 |
| 6,717,198 B2 * | 4/2004 | Yoshikawa et al. | 257/295 |
| 6,750,492 B2 * | 6/2004 | Mikawa et al. | 257/295 |
| 6,794,199 B2 * | 9/2004 | Yoshikawa et al. | 438/3 |
| 2002/0127867 A1 * | 9/2002 | Lee | 438/694 |

FOREIGN PATENT DOCUMENTS

JP   2002-353414   12/2002

* cited by examiner

*Primary Examiner*—T. N. Quach
(74) *Attorney, Agent, or Firm*—Oblon, Spivak, McClelland, Maier & Neustadt, P.C.

(57) ABSTRACT

A ferro-electric memory device includes a first ferro-electric capacitor which is selectively formed on a first insulating film and has a first lower electrode, a first ferro-electric film, and a first upper electrode, a first hydrogen barrier film which has first to third portions, the first portion being formed on the first insulating film, the second portion covering the side surfaces of the first lower electrode, first ferro-electric film, and first upper electrode, and the third portion being formed on the upper surface of the first upper electrode, a first interlayer formed on the second portion, and a second hydrogen barrier film which has fourth to sixth portions, the fourth portion having a first contact portion which comes into contact with at least part of the first portion, the fifth portion being formed on the first interlayer, and the sixth portion being formed on the third portion.

13 Claims, 20 Drawing Sheets

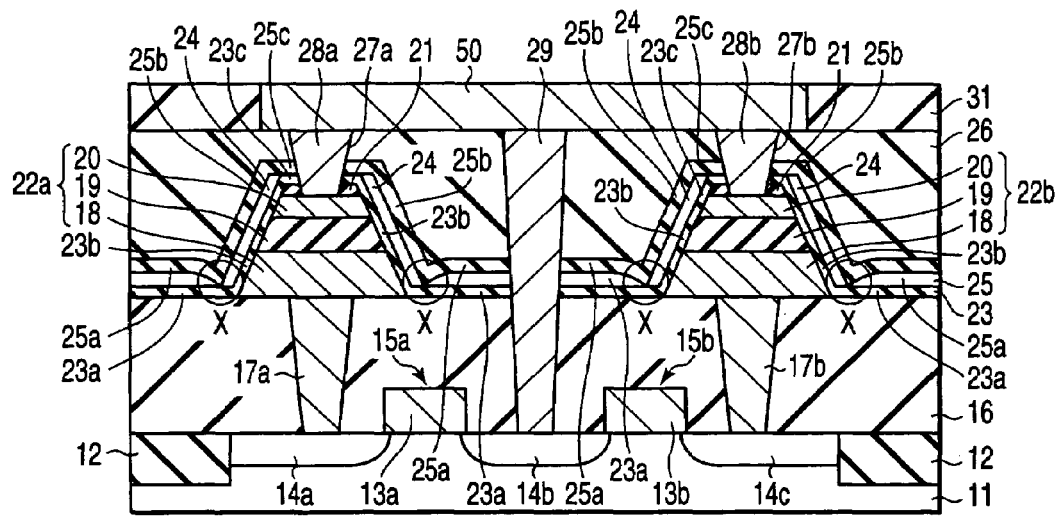
F I G. 4 1
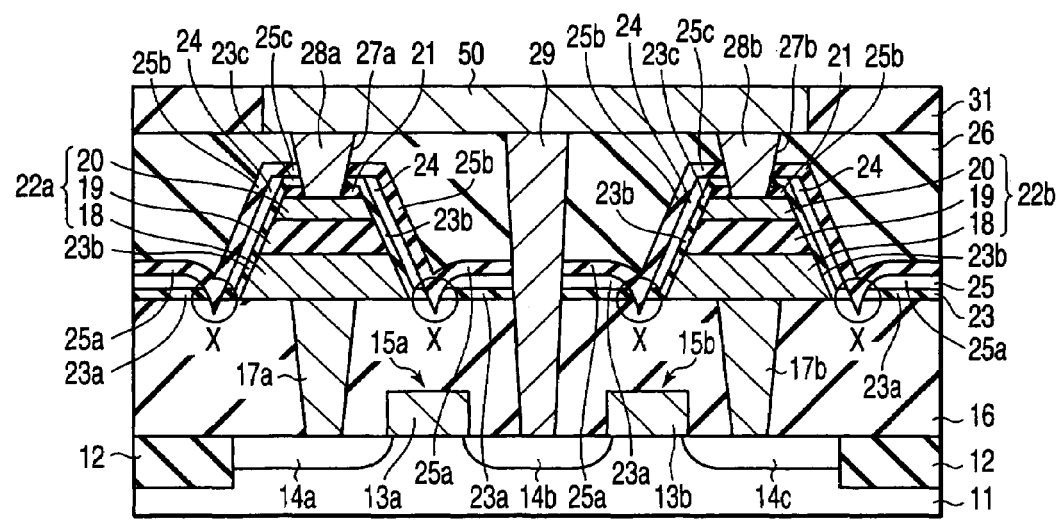
F I G. 4 2

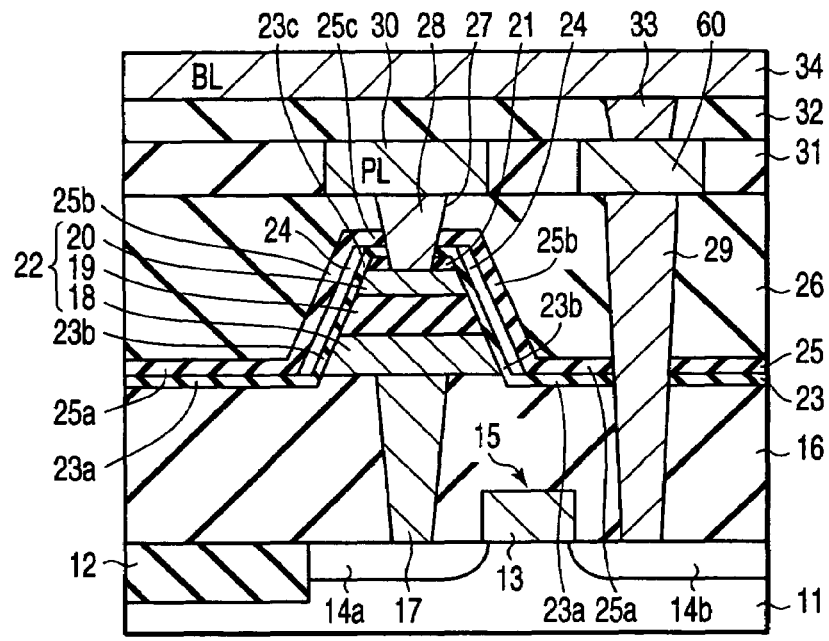
F I G. 4 9
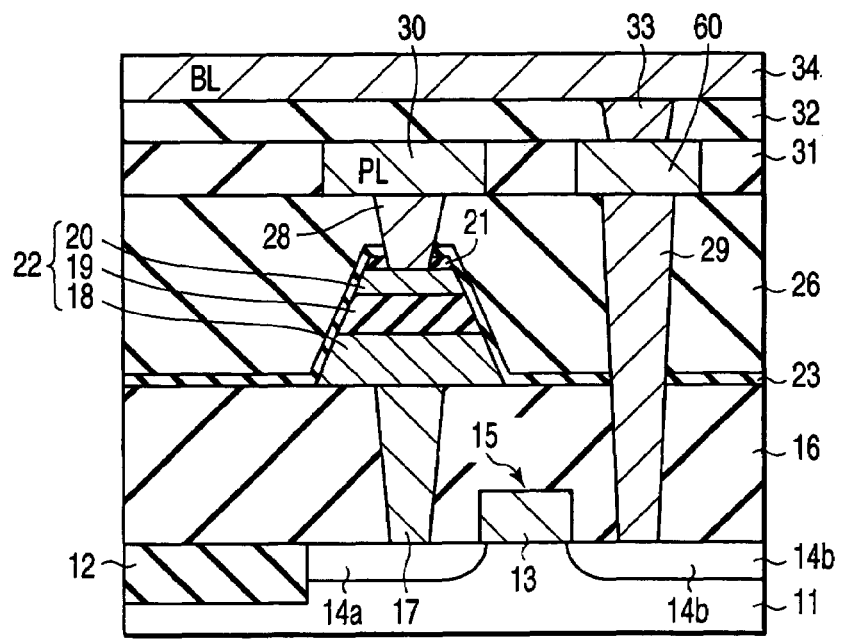
F I G. 5 0 (PRIOR ART)

FERRO-ELECTRIC MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2004-077679, filed Mar. 18, 2004, the entire contents of which are incorporated herein by reference.

BACKGROUND OF THE INVENTION

1. Field of the Invention

The present invention relates to a ferro-electric memory device having a hydrogen barrier film and a method of manufacturing the same.

2. Description of the Related Art

In recent years, ferro-electric memory devices (FeRAM: Ferro-electric Random Access Memory) using a ferro-electric capacitor have received a great deal of attention as a kind of nonvolatile semiconductor memory.

FIG. 50 is a sectional view of a conventional ferro-electric memory device. As shown in FIG. 50, in the conventional ferro-electric memory device, a MOSFET 15 having a gate electrode 13 and source/drain diffusion layers 14a and 14b is formed on a semiconductor substrate 11. An interlayer dielectric film 16 is formed on the MOSFET 15. A ferro-electric capacitor 22 is formed on the interlayer dielectric film 16. The ferro-electric capacitor 22 includes a lower electrode 18, ferro-electric film 19, and upper electrode 20. The upper electrode 20 is connected to a plate line (PL) 30 through a contact 28. The lower electrode 18 is connected to one source/drain diffusion layer 14a of the MOSFET 15 through a contact 17a. A bit line (BL) 34 is connected to the other source/drain diffusion layer 14b of the MOSFET 15 through contacts 29 and 33. In this ferro-electric memory device, the ferro-electric capacitor 22 is covered with a hydrogen barrier film 23 to prevent invasion of hydrogen into the ferro-electric capacitor 22.

However, the hydrogen barrier film 23 may deform by recrystallization in annealing after the ferro-electric capacitor 22 is processed or, deform by migration of the fence substance at a portion where a fence used in processing the ferro-electric capacitor 22 remains. Accordingly, the hydrogen barrier film 23 may have breaks. In this case, hydrogen invades from the contact 29 or the like near the ferro-electric capacitor 22 into it. The hydrogen invaded from breaks in the hydrogen barrier film 23 may degrade the capacitor characteristic.

A prior-art reference associated with the present invention is as follows.

[Patent reference 1] Jpn. Pat. Appln. KOKAI Publication No. 2002-353414.

BRIEF SUMMARY OF THE INVENTION

A ferro-electric memory device according to a first aspect of the present invention comprises a semiconductor substrate, a first transistor which is formed on the semiconductor substrate and has a first gate electrode, a first diffusion layer, and a second diffusion layer, a first insulating film which is formed on the semiconductor substrate and the first transistor, a first ferro-electric capacitor which is selectively formed on the first insulating film and has a first lower electrode, a first ferro-electric film, and a first upper electrode, a first hydrogen barrier film which has a first portion, a second portion, and a third portion, which are continuously formed, the first portion being formed on the first insulating film, the second portion covering a side surface of the first lower electrode, a side surface of the first ferro-electric film, and a side surface of the first upper electrode, and the third portion being formed on an upper surface of the first upper electrode, a first interlayer which is formed on the second portion, and a second hydrogen barrier film which has a fourth portion, a fifth portion, and a sixth portion, which are continuously formed, the fourth portion having a first contact portion which comes into contact with at least part of the first portion, the fifth portion being formed on the first interlayer, and the sixth portion being formed on the third portion.

A method of manufacturing a ferro-electric memory device according to a second aspect of the present invention comprises forming, on a semiconductor substrate, a first transistor which has a first gate electrode, a first diffusion layer, and a second diffusion layer, forming a first insulating film on the semiconductor substrate and the first transistor, forming, on the first insulating film, a first ferro-electric capacitor which has a first lower electrode, a first ferro-electric film, and a first upper electrode, forming a first hydrogen barrier film on the first ferro-electric capacitor and the first insulating film, forming a first interlayer on the first hydrogen barrier film on a side surface of the first ferro-electric capacitor, and forming a second hydrogen barrier film on the first interlayer and the first hydrogen barrier film and forming a first contact portion by bringing at least part of the first hydrogen barrier film and at least part of the second hydrogen barrier film into contact with each other on the first insulating film.

BRIEF DESCRIPTION OF THE SEVERAL VIEWS OF THE DRAWING

FIG. 41 is a sectional view showing a ferro-electric memory device according to the second modification to the fourth embodiment of the present invention;

FIG. 42 is a sectional view showing another ferro-electric memory device according to the second modification to the fourth embodiment of the present invention;

FIG. 49 is a sectional view showing a ferro-electric memory device according to each embodiment of the present invention; and FIG. 50 is a sectional view showing a conventional ferro-electric memory device.

DETAILED DESCRIPTION OF THE INVENTION

Figure 1:
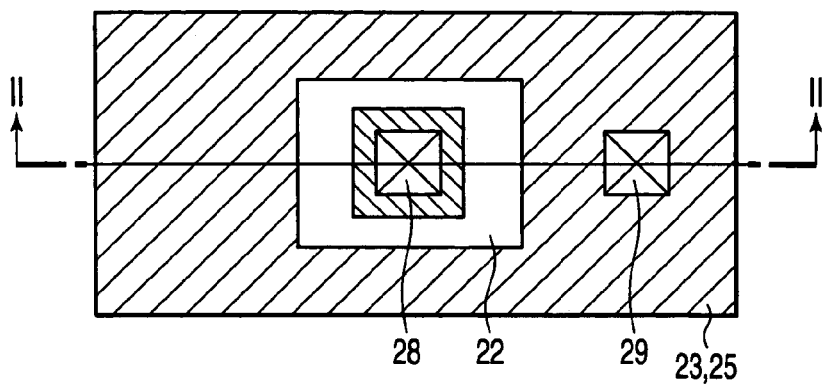
FIG. 1 is a schematic plan view showing a ferro-electric memory device according to the first basic example of the first embodiment of the present invention.

The embodiments of the present invention will be described below with reference to the accompanying drawing. The same reference numerals denote the same parts throughout the drawing.

A. COP (Capacitor On Plug) Type

Ferro-electric memory devices according to the first and second embodiments are examples of COP type memory cells.

[1] First Embodiment

The first embodiment is a COP type memory cell, in which the upper electrode, ferro-electric film, and lower electrode in a ferro-electric capacitor are processed by using one mask.

[1—1] First Basic Example

Figure 2:
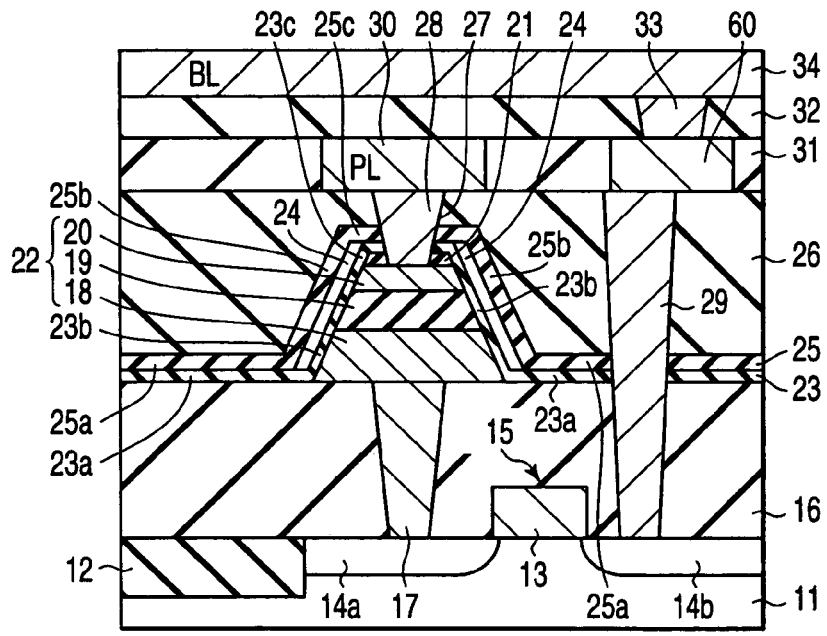
FIG. 2 is a sectional view of the ferro-electric memory device taken along a line II—II in FIG. 1.

FIG. 1 is a schematic plan view of a ferro-electric memory device according to the first basic example of the first embodiment of the present invention. FIG. 2 is a sectional view of the ferro-electric memory device taken along a line II—II in FIG. 1. The structure according to the first basic example of the first embodiment will be described below.

As shown in FIGS. 1 and 2, an element isolation region 12 which isolates an element region is formed in a semiconductor substrate 11. A MOSFET 15 having a gate electrode 13 and source/drain diffusion layers 14a and 14b is formed in the element region. An interlayer dielectric film 16 is formed on the MOSFET 15.

A ferro-electric capacitor 22 is formed on the interlayer dielectric film 16. The ferro-electric capacitor 22 includes a lower electrode 18, ferro-electric film 19, and upper electrode 20. The three layers including the lower electrode 18, ferro-electric film 19, and upper electrode 20 are processed for each cell by using one mask. For this reason, the side surfaces of the three layers are almost flush with each other. The three layers have planar sizes that become large downward or almost equal.

The ferro-electric capacitor 22 is covered with a first hydrogen barrier film 23. The first hydrogen barrier film 23 has first, second, and third portions 23a, 23b, and 23c which are continuously formed. The first portion 23a is formed on the interlayer dielectric film 16. The second portion 23b covers the side surfaces of the lower electrode 18, ferro-electric film 19, and upper electrode 20. The third portion 23c is formed on an insulting film 21 which is formed on the upper electrode 20.

The first hydrogen barrier film 23 is covered with a second hydrogen barrier film 25. The second hydrogen barrier film 25 has fourth, fifth, and sixth portions 25a, 25b, and 25c which are continuously formed. The fourth portion 25a is formed on the first portion 23a of the first hydrogen barrier film 23. The fifth portion 25b is formed on an interlayer 24 which is formed on the second portion 23b of the first hydrogen barrier film 23. The sixth portion 25c is formed on the third portion 23c of the first hydrogen barrier film 23.

The first and second hydrogen barrier films 23 and 25 come into contact with each other and therefore have a first contact portion and a second contact portion. The first contact portion is a region from the lower edge portion of the lower electrode 18 to the upper surface of the interlayer dielectric film 16. At the first contact portion, the first portion 23a and fourth portion 25a come into contact with each other. The second contact portion is a region above the upper electrode 20. At the second contact portion, the third portion 23c and sixth portion 25c come into contact with each other. The first contact portion surrounds the ferro-electric capacitor 22 of each cell (FIG. 1).

The upper electrode 20 of the ferro-electric capacitor 22 is connected to a plate line (PL) 30 through a contact 28. The lower electrode 18 of the ferro-electric capacitor 22 is connected to one source/drain diffusion layer 14a of MOS-FET 15 through a contact 17. A bit line (BL) 34 is connected to the other source/drain diffusion layer 14b of the MOSFET 15 through contacts 29 and 33 and an interconnection 60.

The thickness of the second hydrogen barrier film 25 is preferably almost equal to or larger than that of the first hydrogen barrier film 23. The interlayer 24 can be formed by using various materials such as an insulating material or conductive material. The interlayer 24 is preferably formed from an insulating material.

FIGS. 3 to 11 are sectional views showing steps in manufacturing the ferro-electric memory device according to the first basic example of the first embodiment of the present invention. A manufacturing method according to the first basic example of the first embodiment will be described below.

Figure 3:
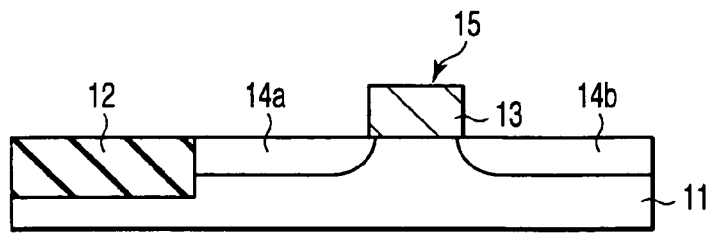
FIGS. 3 to 11 are sectional views showing steps in manufacturing the ferro-electric memory device according to the first basic example of the first embodiment of the present invention.

First, as shown in FIG. 3, the element isolation region 12 having an STI (Shallow Trench Isolation) structure for element isolation is formed in the semiconductor substrate 11. After that the gate electrode 13 is formed on the semiconductor substrate 11. The source/drain diffusion layers 14a and 14b are formed on both sides of the gate electrode 13. In this way, the MOSFET 15 is formed.

Figure 4:
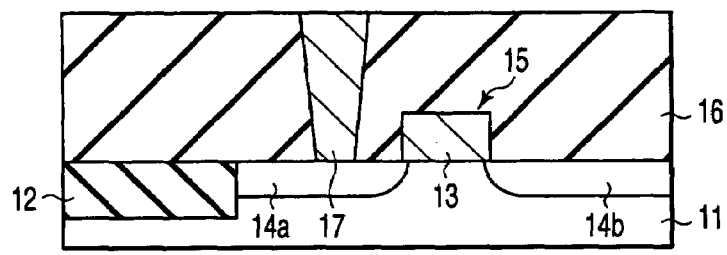

As shown in FIG. 4, the interlayer dielectric film 16 is deposited on the semiconductor substrate 11 and MOSFET 15. The upper surface of the interlayer dielectric film 16 is planarized by, e.g., CMP (Chemical Mechanical Polishing). Examples of the material of the interlayer dielectric film 16 are BPSG (Boron Phosphorous Silicate Glass) and P-TEOS (Plasma-Tetra Ethoxy Silane). The contact 17 connected to the source/drain diffusion layer 14a is formed in the interlayer dielectric film 16.

Figure 5:
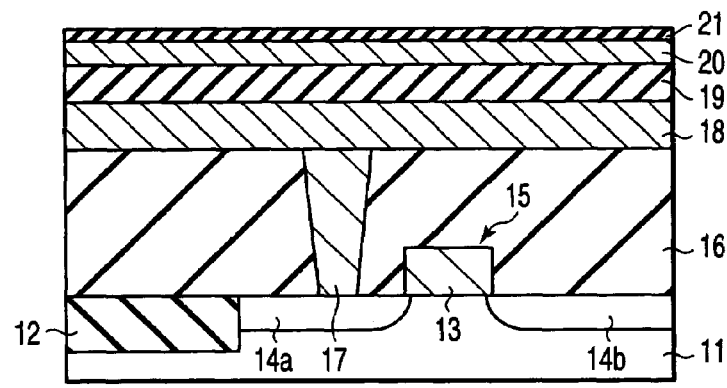

As shown in FIG. 5, the lower electrode 18, ferro-electric film 19, upper electrode 20, and insulting film 21 are sequentially deposited on the interlayer dielectric film 16 and contact 17. The lower electrode 18 is made of a material containing, e.g., Ir, $IrO_2$, Ru, $RuO_2$, or Pt. Examples of the material of the ferro-electric film 19 are PZT and SBT. Examples of the material of the upper electrode 20 are Pt, Ir, $IrO_2$, SRO, Ru, and $RuO_2$.

Figure 6:
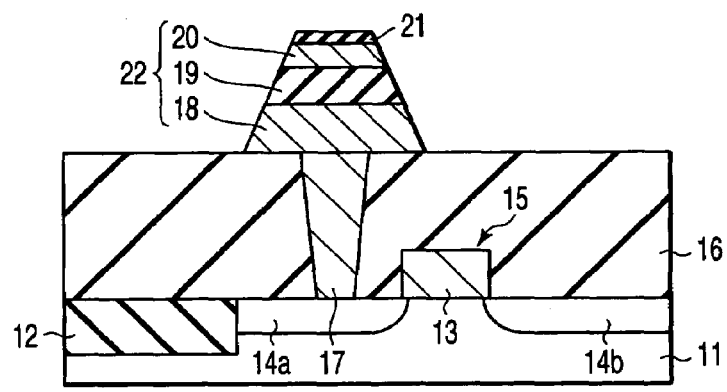

As shown in FIG. 6, the insulting film 21, upper electrode 20, ferro-electric film 19, and lower electrode 18 are patterned. With this process, the ferro-electric capacitor 22 is formed for each cell.

Figure 7:
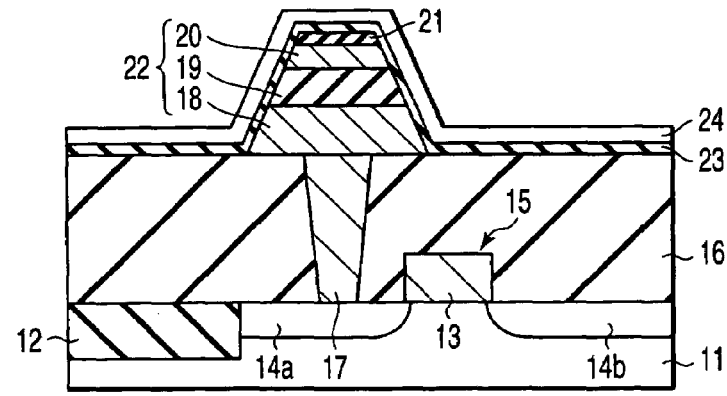

As shown in FIG. 7, the first hydrogen barrier film 23 having insulting properties is formed on the upper surface of the interlayer dielectric film 16, the side surfaces of the ferro-electric capacitor 22, and the upper and side surfaces of the insulting film 21 by sputtering or CVD (Chemical Vapor Deposition). Examples of the material of the first hydrogen barrier film 23 are $Al_2O_3$, SiN, SiON, $TiO_2$, and PZT. The interlayer 24 is deposited on the first hydrogen barrier film 23. Examples of the material of the interlayer 24 are P-TEOS, $O_3$-TEOS, SOG, $Al_2O_3$, SiN, SiON, PZT, and SBT as insulating materials and TiAlN as a conductive material.

Figure 8:
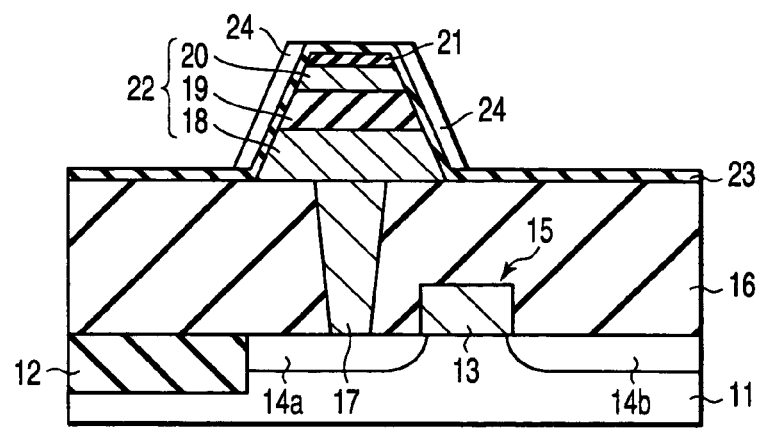

As shown in FIG. 8, the interlayer 24 is etched back until the first hydrogen barrier film 23 is exposed. The interlayer 24 remains only on the side surfaces of the first hydrogen barrier film 23.

Figure 9:
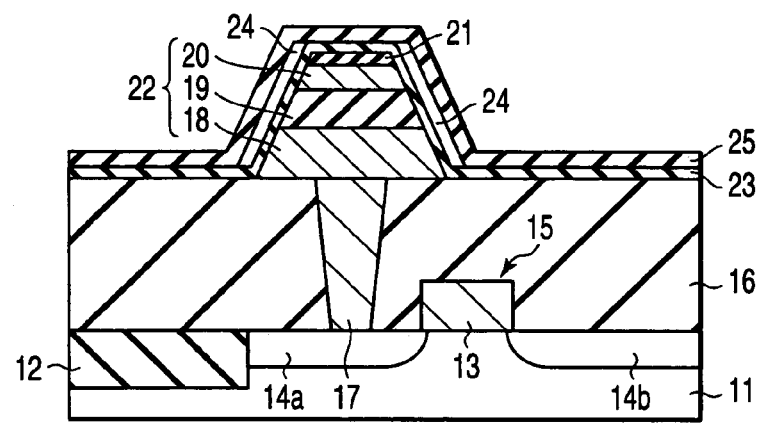

As shown in FIG. 9, the second hydrogen barrier film 25 is formed on the interlayer 24 and first hydrogen barrier film 23. Accordingly, the first hydrogen barrier film 23 and second hydrogen barrier film 25 come into contact with each other near the lower edge portion of the lower electrode 18 and above the upper electrode 20.

Figure 10:
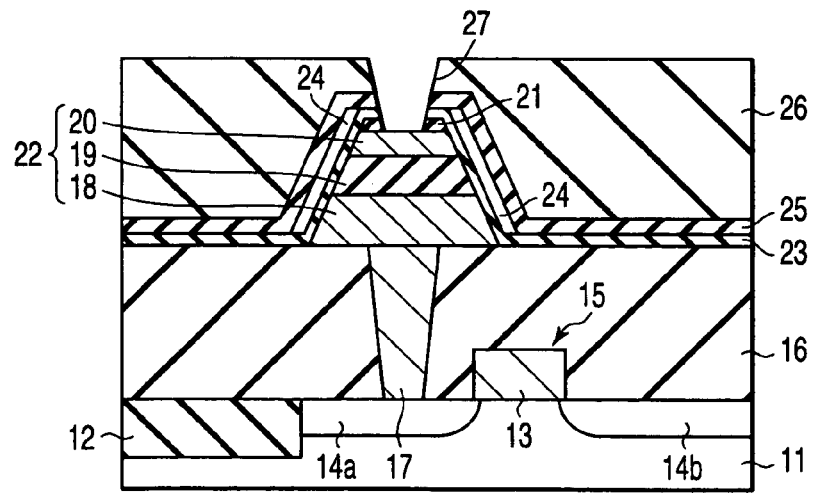

As shown in FIG. 10, an interlayer dielectric film 26 is deposited on the second hydrogen barrier film 25. The upper surface of the interlayer dielectric film 26 is planarized. A contact hole 27 to which the upper electrode 20 is exposed is formed. After that, high-temperature annealing is executed, e.g., at 650° C. in an oxygen atmosphere for 1 hr to recover the damage of the ferro-electric capacitor 22.

Figure 11:
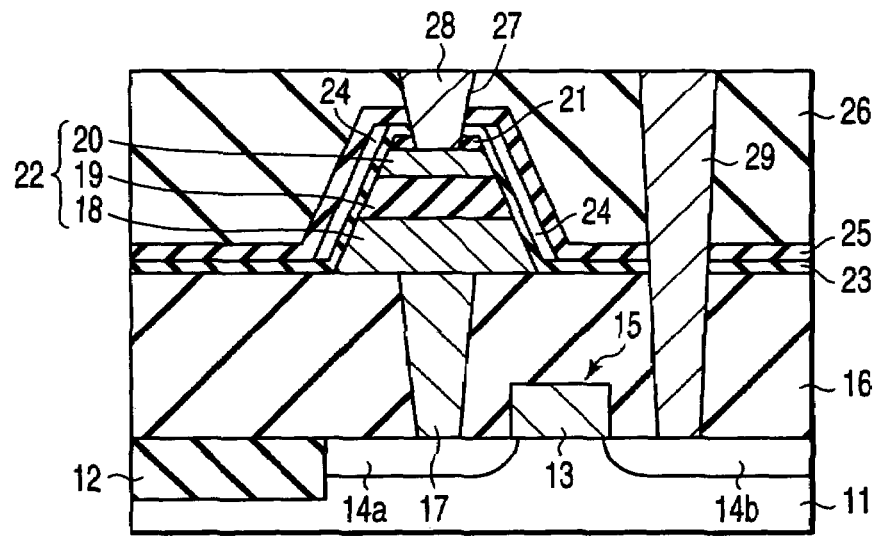

As shown in FIG. 11, the contact hole 27 is filled with a metal material containing, e.g., Ti, TiN, or W. The upper surface of the metal material is planarized. Accordingly, the contact 28 connected to the upper electrode 20 is formed. Next, the contact 29 connected to the source/drain diffusion layer 14b is formed. To fill a contact hole such as the contact 29 having a high aspect ratio, it is filled with a metal material by using plasma CVD.

Next, as shown in FIG. 2, the plate line 30 and interconnection 60, which are made of, e.g., W, Cu, Al, or TiN, are formed. Interlayer dielectric films 31 and 32 are formed. The contact 33 connected to the interconnection 60 is formed. After that, the bit line 34 connected to the contact 33 is formed. A ferro-electric memory device is thus formed.

According to the first basic example of the first embodiment of the present invention, the first portion 23a of the first hydrogen barrier film 23 and the fourth portion 25a of the second hydrogen barrier film 25 come into contact with each other between the ferro-electric capacitor 22 and the contact 29 near the lower edge portion of the lower electrode 18. Hence, the first contact portion which surrounds the ferro-electric capacitor 22 is present. The first contact portion can prevent invasion of hydrogen from the contact 29 to the ferro-electric capacitor 22 through the interlayer 24. For this reason, any degradation of the ferro-electric capacitor 22 can be prevented, and a highly reliable ferro-electric memory device can be provided.

The second portion 23b of the first hydrogen barrier film 23 formed on the side surfaces of the ferro-electric capacitor 22 is covered with the interlayer 24 and the second hydrogen barrier film 25 formed on it. For this reason, even when the first hydrogen barrier film 23 is partially broken during the manufacturing process, the second hydrogen barrier film 25 can prevent invasion of hydrogen from the breaks of the first hydrogen barrier film 23 into the ferro-electric capacitor 22.

[1-2] First Modification

In the first modification to the first embodiment, the contact 29 near the ferro-electric capacitor in the first basic example is formed from a plurality of contacts.

Figure 12:
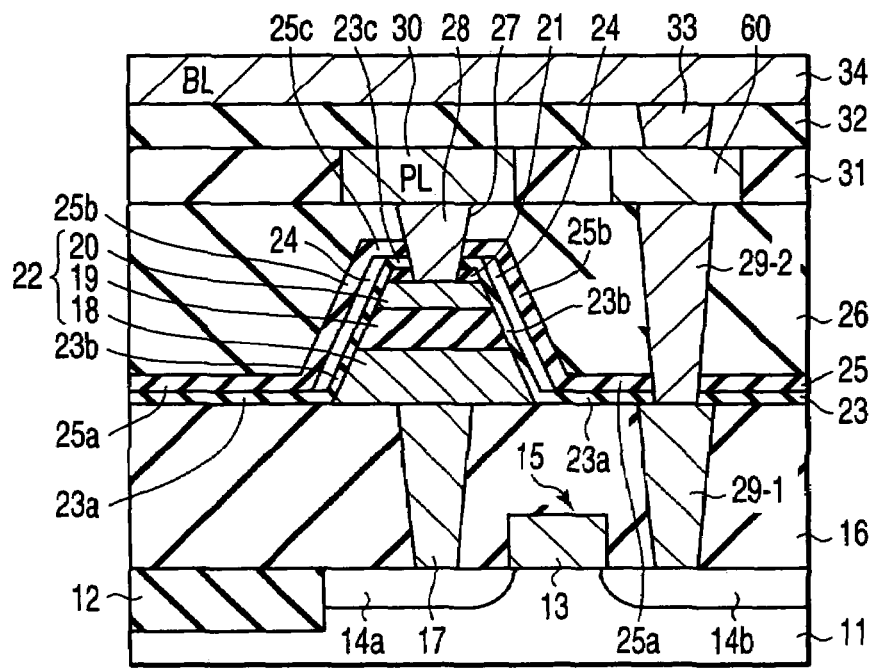
FIG. 12 is a sectional view showing a ferro-electric memory device according to the first modification to the first embodiment of the present invention.

FIG. 12 is a sectional view of a ferro-electric memory device according to the first modification to the first embodiment of the present invention. The structure according to the first modification to the first embodiment will be described below.

As shown in FIG. 12, the first modification to the first embodiment is different from the first basic example in that the contact located near the ferro-electric capacitor 22 is formed from, e.g., two contacts 29-1 and 29-2. The contact 29-1 is formed simultaneously with the contact 17. The contact 29-2 is formed after formation of the contact 28.

According to the first modification to the first embodiment, the same effect as in the first basic example can be obtained. In addition, formation and filling of the contacts 29-1 and 29-2 are easier than in the first basic example.

[1-3] Second Modification

In the second modification to the first embodiment, the first contact portion in the first basic example is modified.

Figure 13:
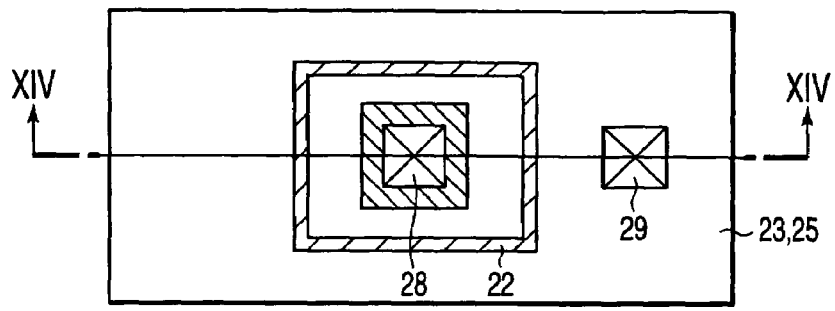
FIG. 13 is a schematic plan view showing a ferro-electric memory device according to the second modification to the first embodiment of the present invention.
Figure 14:
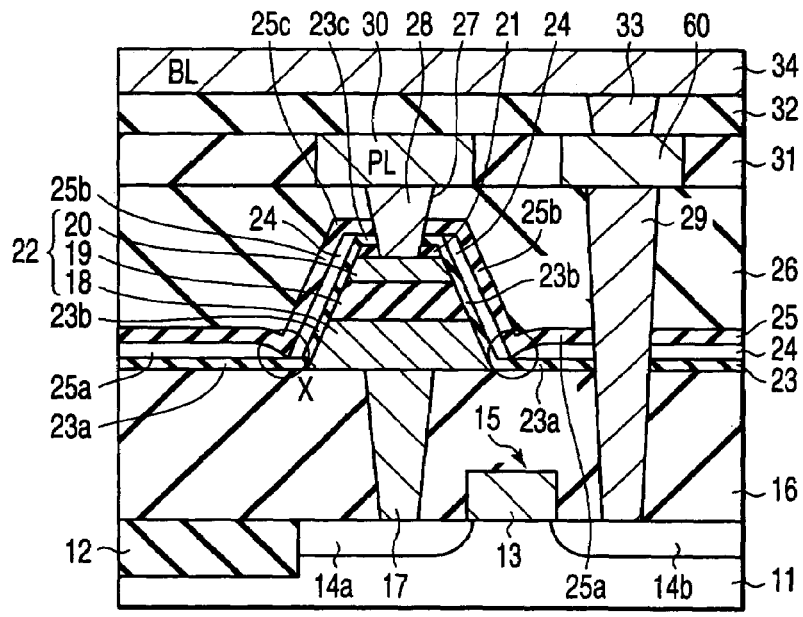
FIG. 14 is a sectional view showing the ferro-electric memory device taken along a line XIV—XIV in FIG. 13.

FIG. 13 is a schematic plan view of a ferro-electric memory device according to the second modification to the first embodiment of the present invention. FIG. 14 is a sectional view of the ferro-electric memory device taken along a line XIV—XIV in FIG. 13. The structure according to the second modification to the first embodiment will be described below.

As shown in FIGS. 13 and 14, the second modification to the first embodiment is different from the first basic example in that the first contact portion where the first portion 23a of the first hydrogen barrier film 23 and the fourth portion 25a of the second hydrogen barrier film 25 come into contact with each other has a smaller area.

That is, instead of bringing the first portion 23a and fourth portion 25a into contact with each other all over the surfaces, as in the first basic example, only a boundary portion X between the fourth portion 25a and the fifth portion 25b of the second hydrogen barrier film 25 comes into contact with the first portion 23a of the first hydrogen barrier film 23 at the lower edge portion of the lower electrode 18. The interlayer 24 is present between the first portion 23a and the fourth portion 25a.

Figure 15:
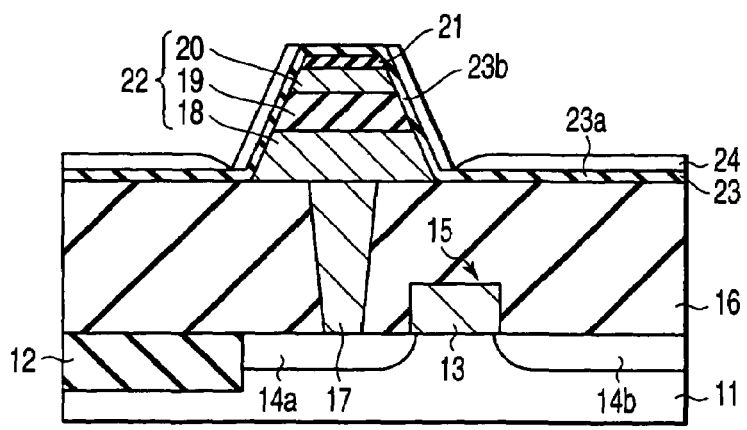
FIG. 15 is a sectional view showing steps in manufacturing the ferro-electric memory device according to the second modification to the first embodiment of the present invention.

FIG. 15 is a sectional view showing steps in manufacturing the ferro-electric memory device according to the second modification to the first embodiment of the present invention. The manufacturing method according to the second modification to the first embodiment will be described below.

First, with the steps shown in FIGS. 3 to 7, the first hydrogen barrier film 23 and interlayer 24 are deposited to cover the ferro-electric capacitor 22, as in the first basic example.

Next, as shown in FIG. 15, the interlayer 24 is etched back. At this time, etching progresses near the lower edge portion of the lower electrode 18, and the first hydrogen barrier film 23 at this portion is exposed. The etching is stopped at this stage. Accordingly, the interlayer 24 remains not only on the second portion 23b but also on the first portion 23a.

Then, as shown in FIG. 14, the second hydrogen barrier film 25 is deposited on the first hydrogen barrier film 23 and interlayer 24. Accordingly, the boundary portion X between the fourth portion 25a and the fifth portion 25b of the second hydrogen barrier film 25 comes into contact with the first hydrogen barrier film 23. Subsequent manufacturing steps are the same as in the first basic example, and a description thereof will be omitted.

According to the second modification to the first embodiment, the same effect as in the first basic example can be obtained.

In the second modification, the interlayer 24 made of the same material as that between the second portion 23b and the fifth portion 25b is formed between the first portion 23a and the fourth portion 25a. Hence, when the interlayer 24 is formed from a low-stress insulating film, stress on the hydrogen barrier films can be relaxed even at the first portion 23a and fourth portion 25a. For this reason, any defect formation due to breaks in the hydrogen barrier film can be suppressed.

Figure 16:
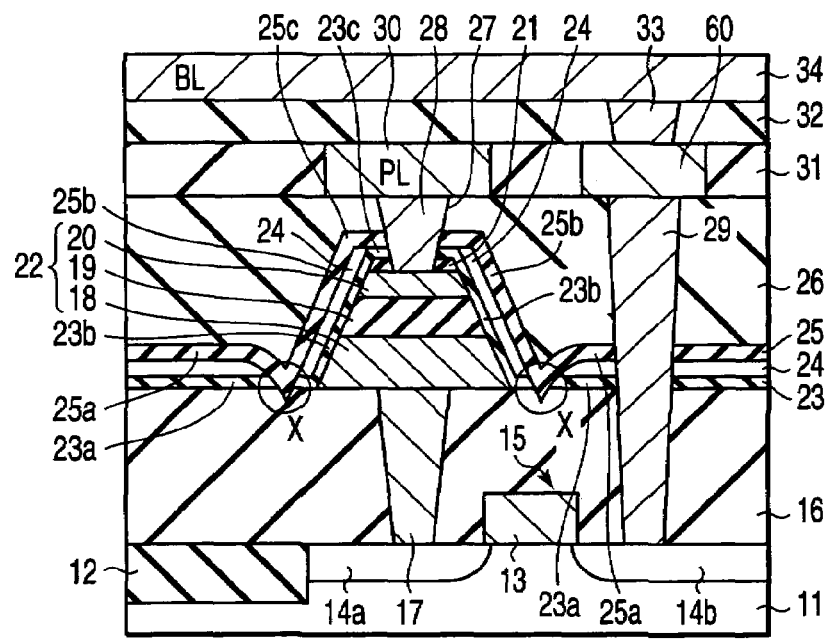
FIG. 16 is a sectional view showing another ferro-electric memory device according to the second modification to the first embodiment of the present invention.

As shown in FIG. 16, at the boundary portion X between the fourth portion 25a and the fifth portion 25b, the second hydrogen barrier film 25 may penetrate the first hydrogen barrier film 23 and reach the interlayer dielectric film 16 under it.

[1-4] Third Modification

In the third modification to the first embodiment, the second contact portion in the first basic example is not present.

Figure 18:
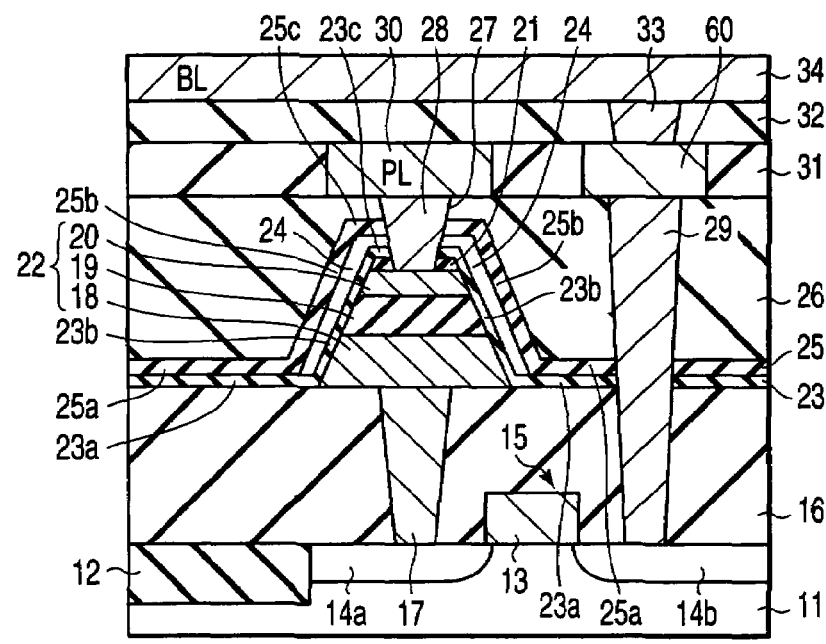
FIG. 18 is a sectional view showing the ferro-electric memory device taken along a line XVIII—XVIII in FIG. 17.
Figure 17:
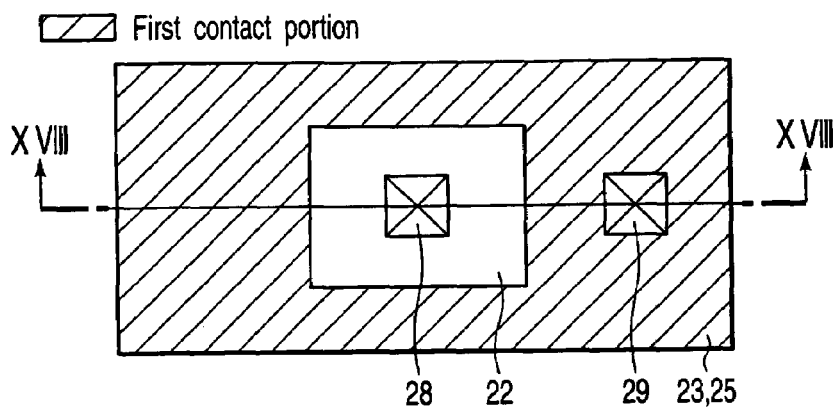
FIG. 17 is a schematic plan view showing a ferro-electric memory device according to the third modification to the first embodiment of the present invention.

FIG. 17 is a schematic plan view of a ferro-electric memory device according to the third modification to the first embodiment of the present invention. FIG. 18 is a sectional view of the ferro-electric memory device taken along a line XVIII—XVIII in FIG. 17. The structure according to the third modification to the first embodiment will be described below.

As shown in FIGS. 17 and 18, the third modification to the first embodiment is different from the first basic example in that the first hydrogen barrier film 23 and second hydrogen barrier film 25 do not come into contact with each other above the upper electrode 20. That is, the interlayer 24 is present between the third portion 23c of the first hydrogen barrier film 23 and the sixth portion 25c of the second hydrogen barrier film 25.

Figure 19:
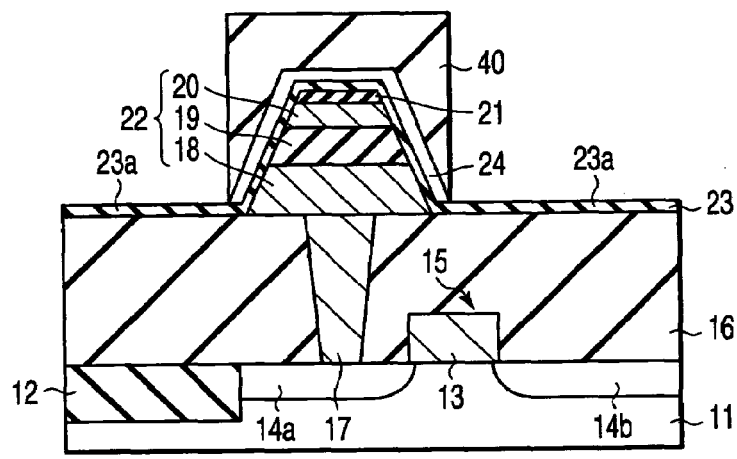
FIG. 19 is a sectional view showing steps in manufacturing the ferro-electric memory device according to the third modification to the first embodiment of the present invention.

FIG. 19 is a sectional view showing steps in manufacturing the ferro-electric memory device according to the third modification to the first embodiment of the present invention. The manufacturing method according to the third modification to the first embodiment will be described below.

First, with the steps shown in FIGS. 3 to 7, the first hydrogen barrier film 23 and interlayer 24 are deposited to cover the ferro-electric capacitor 22, as in the first basic example.

Next, as shown in FIG. 19, only the interlayer 24 on the first portion 23a of the first hydrogen barrier film 23 is etched by using a mask layer 40. Accordingly, the interlayer 24 remains only on the side surfaces and upper surface of the ferro-electric capacitor 22.

Then, as shown in FIG. 18, the second hydrogen barrier film 25 is deposited on the first hydrogen barrier film 23 and interlayer 24. Accordingly, the third portion 23c of the first hydrogen barrier film 23 and sixth portion 25c of the second hydrogen barrier film 25 do not come into contact with each other. Subsequent manufacturing steps are the same as in the first basic example, and a description thereof will be omitted.

According to the third modification to the first embodiment, the same effect as in the first basic example can be obtained.

In the third modification, the interlayer 24 is present between the second portion 23b and the fifth portion 25b and between the third portion 23c and the sixth portion 25c, which cover the ferro-electric capacitor 22. For this reason, the influence of stress of the second hydrogen barrier film 25 on the ferro-electric capacitor 22 can be reduced.

[1-5] Fourth Modification

In the fourth modification to the first embodiment, the position of the bit line 34 in the first basic example is changed.

Figure 20:
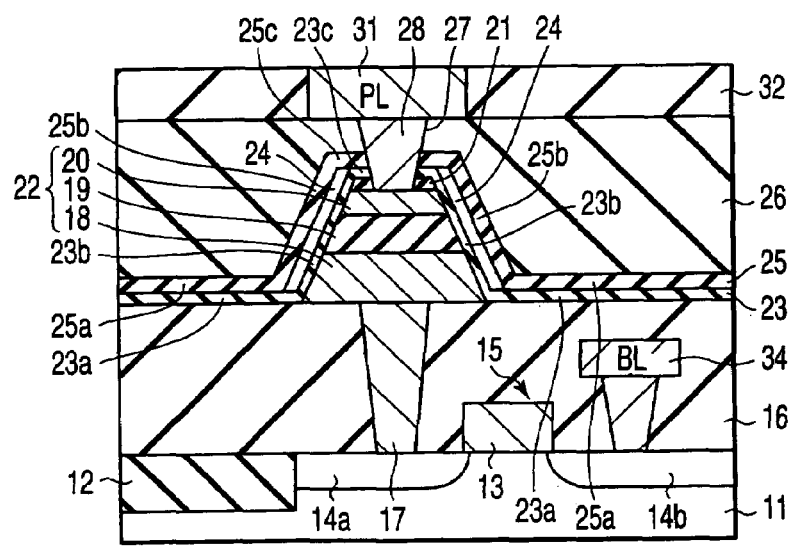
FIG. 20 is a sectional view showing a ferro-electric memory device according to the fourth modification to the first embodiment of the present invention.

FIG. 20 is a sectional view of a ferro-electric memory device according to the fourth modification to the first embodiment of the present invention. The structure according to the fourth modification to the first embodiment will be described below.

As shown in FIG. 20, the fourth modification to the first embodiment is different from the first basic example in that the bit line 34 is arranged under the ferro-electric capacitor 22. That is, the bit line 34 is formed in the interlayer dielectric film 16 under the ferro-electric capacitor 22 and connected to the source/drain diffusion layer 14b through a contact.

According to the fourth modification to the first embodiment, the same effect as in the first basic example can be obtained.

FIG. 20 illustrates no contact near the ferro-electric capacitor 22. A contact is sometimes present adjacent to a cell in a sense amplifier or decoder. Hence, the structure according to the fourth modification to the first embodiment can effectively be used against hydrogen invasion from such a contact.

[2] Second Embodiment

The second embodiment is a COP type memory cell, in which the upper electrode, ferro-electric film, and lower electrode in a ferro-electric capacitor are processed by using two masks.

[2-1] Second Basic Example

Figure 21:
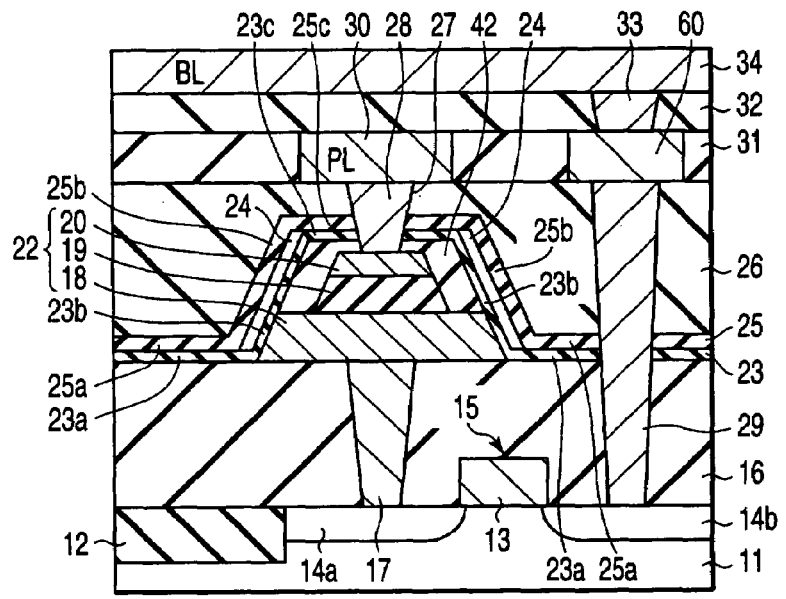
FIG. 21 is a sectional view showing a ferro-electric memory device according to the second basic example of the second embodiment of the present invention.

FIG. 21 is a sectional view of a ferro-electric memory device according to the second basic example of the second embodiment of the present invention. The structure according to the second basic example of the second embodiment will be described below.

As shown in FIG. 21, the second basic example of the second embodiment is different from the first basic example of the first embodiment in the structure of a ferro-electric capacitor 22. In the first basic example, the ferro-electric capacitor 22 is formed by using one mask. In the second basic example, the ferro-electric capacitor 22 is formed by using two masks. In the second basic example, since a ferro-electric film 19 and upper electrode 20 are formed by using a mask different from that used for a lower electrode 18, the ferro-electric film 19 and upper electrode 20 have a planar shape different from that of the lower electrode 18.

More specifically, the lower electrode 18 has a larger planar size than the ferro-electric film 19 and upper electrode 20. The side surface of the ferro-electric film 19 is almost flush with that of the upper electrode 20. The planar size of the ferro-electric film 19 is larger than or almost equal to that of the upper electrode 20.

FIGS. 22 to 25 are sectional views showing steps in manufacturing the ferro-electric memory device according to the second basic example of the second embodiment of the present invention. A manufacturing method according to the second basic example of the second embodiment will be described below.

First, with the steps shown in FIGS. 3 and 4, a MOSFET 15 and contact 17 are formed, as in the first basic example of the first embodiment.

Figure 22:
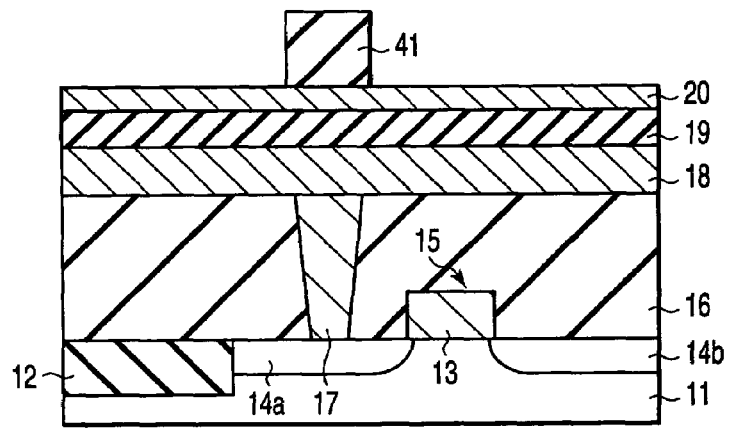
FIGS. 22 to 25 are sectional views showing steps in manufacturing the ferro-electric memory device according to the second basic example of the second embodiment of the present invention.

Next, as shown in FIG. 22, the lower electrode 18, ferro-electric film 19, and upper electrode 20 are sequentially deposited on an interlayer dielectric film 16 and the contact 17. A first mask layer 41 is deposited on the upper electrode 20 and patterned.

Figure 23:
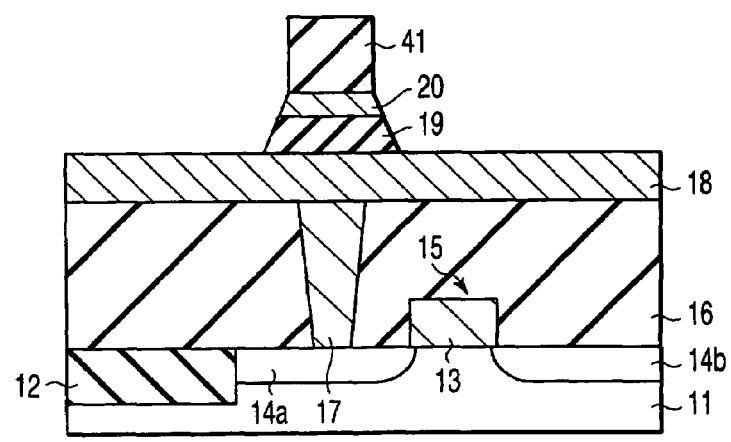

As shown in FIG. 23, the ferro-electric film 19 and upper electrode 20 are patterned by using the first mask layer 41. After that, the first mask layer 41 is removed.

Figure 24:
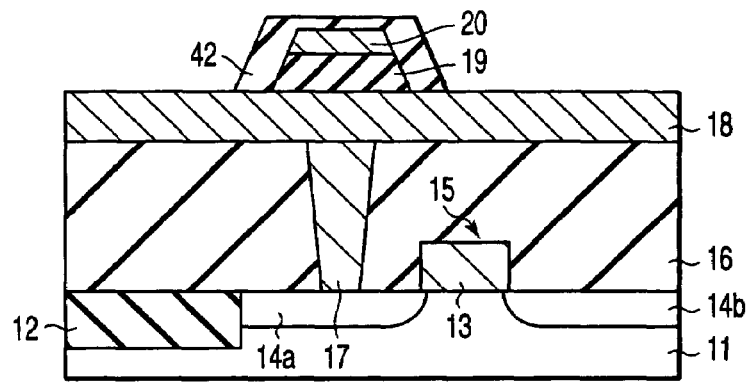

As shown in FIG. 24, a second mask layer 42 is deposited on the upper electrode 20 and lower electrode 18 and patterned.

Figure 25:
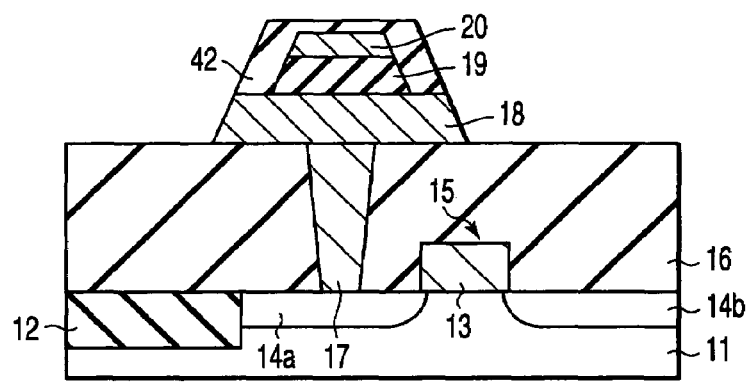

As shown in FIG. 25, the lower electrode 18 is patterned by using the second mask layer 42. With this process, the ferro-electric capacitor 22 processed by using the two masks is formed.

Next, as shown in FIG. 21, a first hydrogen barrier film 23 is deposited on the second mask layer 42 and interlayer dielectric film 16. Subsequent manufacturing steps are the same as in the first basic example of the first embodiment, and a description thereof will be omitted.

In the above description, the second mask layer 42 remains even after the lower electrode 18 is processed. However, the second mask layer 42 may be removed.

According to the second basic example to the second embodiment, the same effect as in the first basic example of the first embodiment can be obtained. In addition, the risk to short-circuit the upper electrode 20 and lower electrode 18 can be suppressed as compared to the first basic example.

[2—2] First Modification

In the first modification to the second embodiment, a contact 29 near the ferro-electric capacitor in the second basic example is formed from a plurality of contacts.

Figure 26:
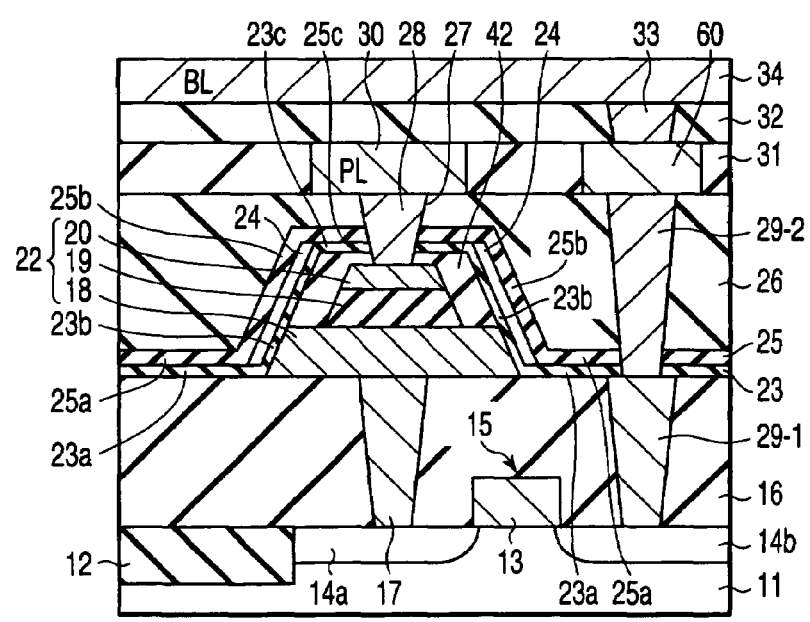
FIG. 26 is a sectional view showing a ferro-electric memory device according to the first modification to the second embodiment of the present invention.

FIG. 26 is a sectional view of a ferro-electric memory device according to the first modification to the second embodiment of the present invention. The structure according to the first modification to the second embodiment will be described below.

As shown in FIG. 26, the first modification to the second embodiment is different from the second basic example in that the contact located near the ferro-electric capacitor 22 is formed from, e.g., two contacts 29-1 and 29-2. The contact 29-1 is formed simultaneously with the contact 17. The contact 29-2 is formed after formation of a contact 28.

According to the first modification to the second embodiment, the same effect as in the second basic example can be obtained. In addition, formation and filling of the contacts 29-1 and 29-2 are easier than in the second basic example.

[2-3] Second Modification

In the second modification to the second embodiment, the first contact portion in the second basic example is modified.

Figure 27:
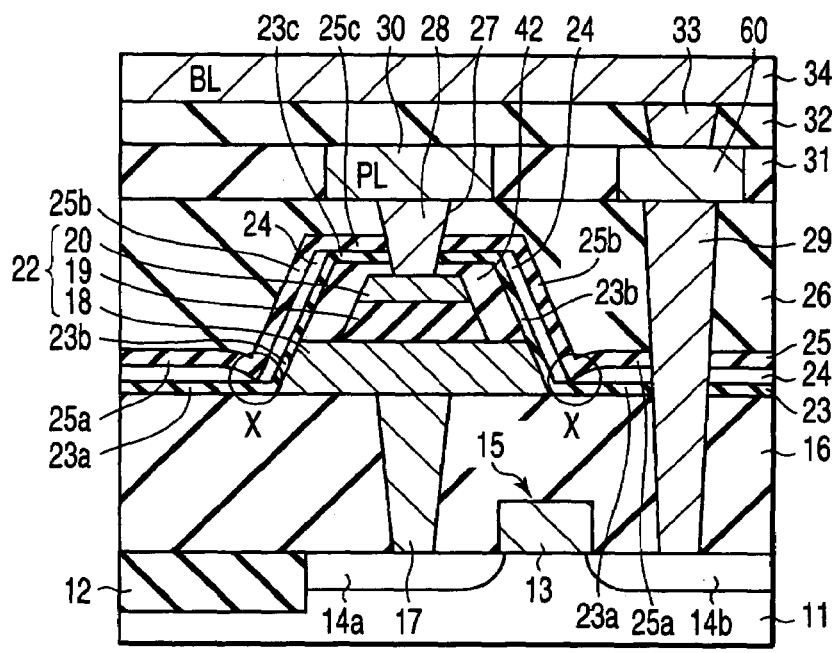
FIG. 27 is a sectional view showing a ferro-electric memory device according to the second modification to the second embodiment of the present invention.

FIG. 27 is a sectional view of a ferro-electric memory device according to the second modification to the second embodiment of the present invention. The structure according to the second modification to the second embodiment will be described below.

As shown in FIG. 27, the second modification to the second embodiment is different from the second basic example in that the first contact portion where a first portion 23a of the first hydrogen barrier film 23 and a fourth portion 25a of a second hydrogen barrier film 25 come into contact with each other has a smaller area.

That is, instead of bringing the first portion 23a and fourth portion 25a into contact with each other all over the surfaces, as in the second basic example, only a boundary portion X between the fourth portion 25a and a fifth portion 25b of the second hydrogen barrier film 25 comes into contact with the first portion 23a of the first hydrogen barrier film 23 at the lower edge portion of the lower electrode 18. An interlayer 24 is present between the first portion 23a and the fourth portion 25a.

According to the second modification to the second embodiment, the same effect as in the second basic example can be obtained.

In the second modification, the interlayer 24 made of the same material as that between a second portion 23b and the fifth portion 25b is formed between the first portion 23a and the fourth portion 25a. Hence, when the interlayer 24 is formed from a low-stress insulating film, stress on the hydrogen barrier films can be relaxed even at the first portion 23a and fourth portion 25a. For this reason, any defect formation due to breaks in the hydrogen barrier film can be suppressed.

Figure 28:
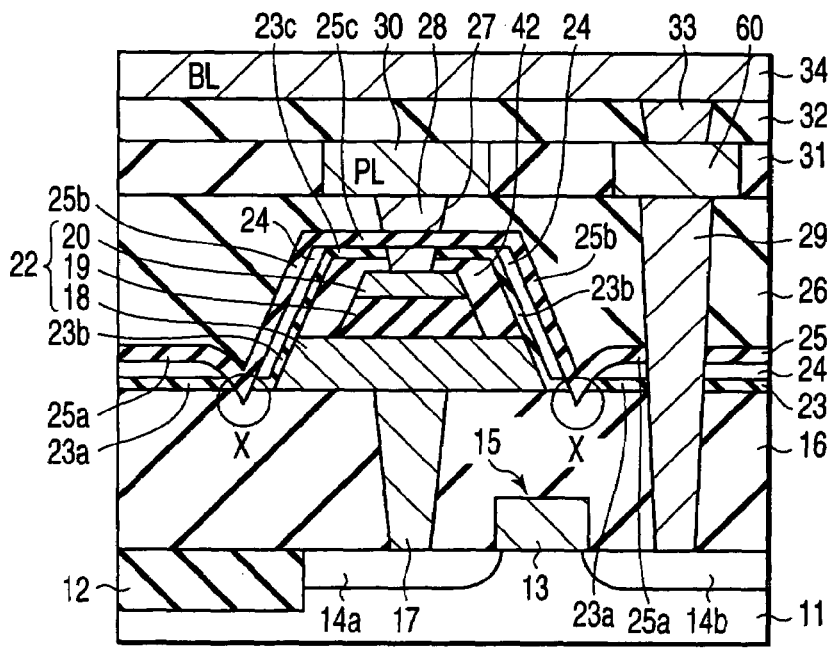
FIG. 28 is a sectional view showing another ferro-electric memory device according to the second modification to the second embodiment of the present invention.

As shown in FIG. 28, at the boundary portion X between the fourth portion 25a and the fifth portion 25b, the second hydrogen barrier film 25 may penetrate the first hydrogen barrier film 23 and reach the interlayer dielectric film 16 under it.

[2-4] Third Modification

In the third modification to the second embodiment, the second contact portion in the second basic example is not present.

Figure 29:
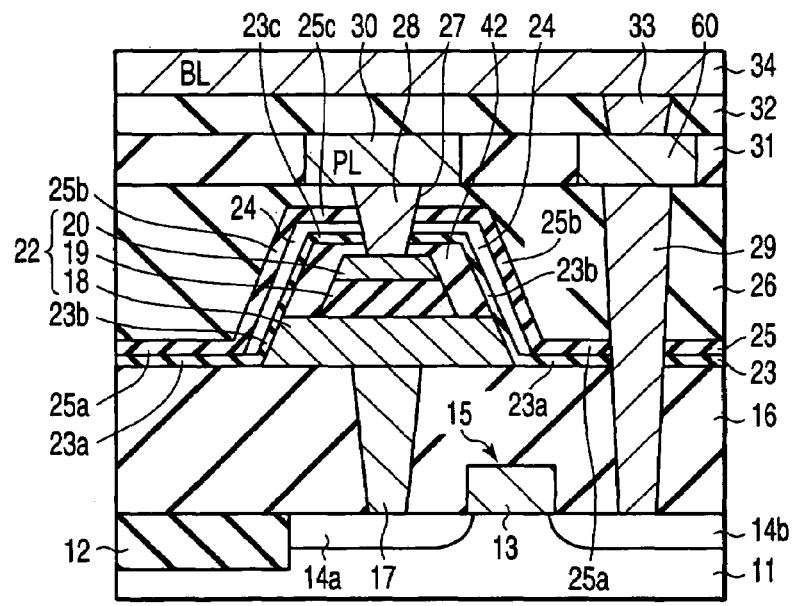
FIG. 29 is a sectional view showing a ferro-electric memory device according to the third modification to the second embodiment of the present invention.

FIG. 29 is a sectional view of a ferro-electric memory device according to the third modification to the second embodiment of the present invention. The structure according to the third modification to the second embodiment will be described below.

As shown in FIG. 29, the third modification to the second embodiment is different from the second basic example in that the first hydrogen barrier film 23 and second hydrogen barrier film 25 do not come into contact with each other above the upper electrode 20. That is, the interlayer 24 is present between a third portion 23c of the first hydrogen barrier film 23 and a sixth portion 25c of the second hydrogen barrier film 25.

According to the third modification to the second embodiment, the same effect as in the second basic example can be obtained.

In the third modification, the interlayer 24 is present between the second portion 23b and the fifth portion 25b and between the third portion 23c and the sixth portion 25c, which cover the ferro-electric capacitor 22. For this reason, the influence of stress of the second hydrogen barrier film 25 on the ferro-electric capacitor 22 can be reduced. When the connection portion between the first hydrogen barrier film 23 and the second hydrogen barrier film 25 is made robust, defective connection points can largely be decreased.

[2-5] Fourth Modification

In the fourth modification to the second embodiment, the position of the bit line in the second basic example is changed.

Figure 30:
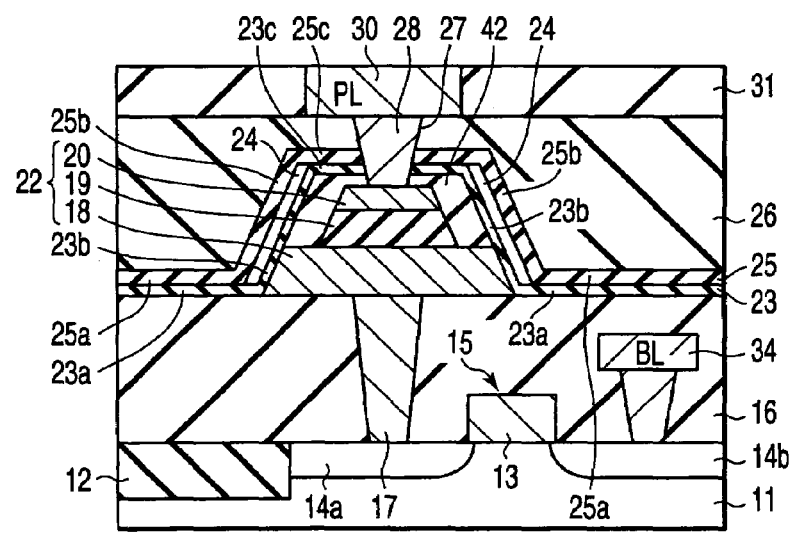
FIG. 30 is a sectional view showing a ferro-electric memory device according to the fourth modification to the second embodiment of the present invention.

FIG. 30 is a sectional view of a ferro-electric memory device according to the fourth modification to the second embodiment of the present invention. The structure according to the fourth modification to the second embodiment will be described below.

As shown in FIG. 30, the fourth modification to the second embodiment is different from the second basic example in that a bit line 34 is arranged under the ferro-electric capacitor 22. That is, the bit line 34 is formed in the interlayer dielectric film 16 under the ferro-electric capacitor 22 and connected to a source/drain diffusion layer 14b through a contact.

According to the fourth modification to the second embodiment, the same effect as in the second basic example can be obtained.

B. Offset Type

[3] Third Embodiment

The third embodiment is an offset type memory cell, in which the upper electrode, ferro-electric film, and lower electrode in a ferro-electric capacitor are processed by using two masks.

[3-1] Third Basic Example

Figure 31:
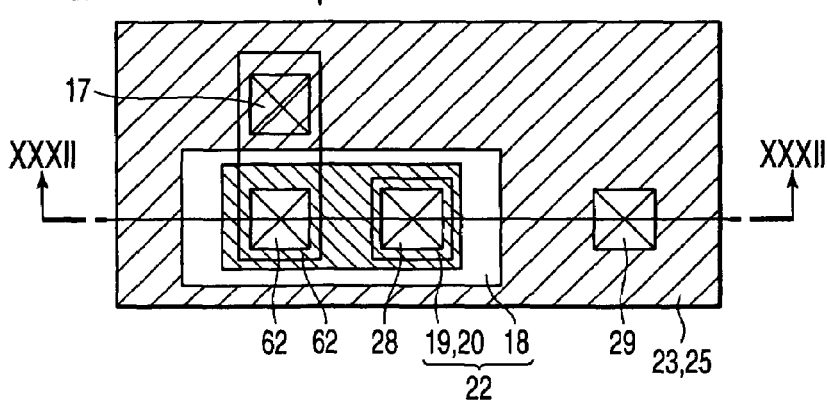
FIG. 31 is a schematic plan view showing a ferro-electric memory device according to the third basic example of the third embodiment of the present invention.
Figure 32:
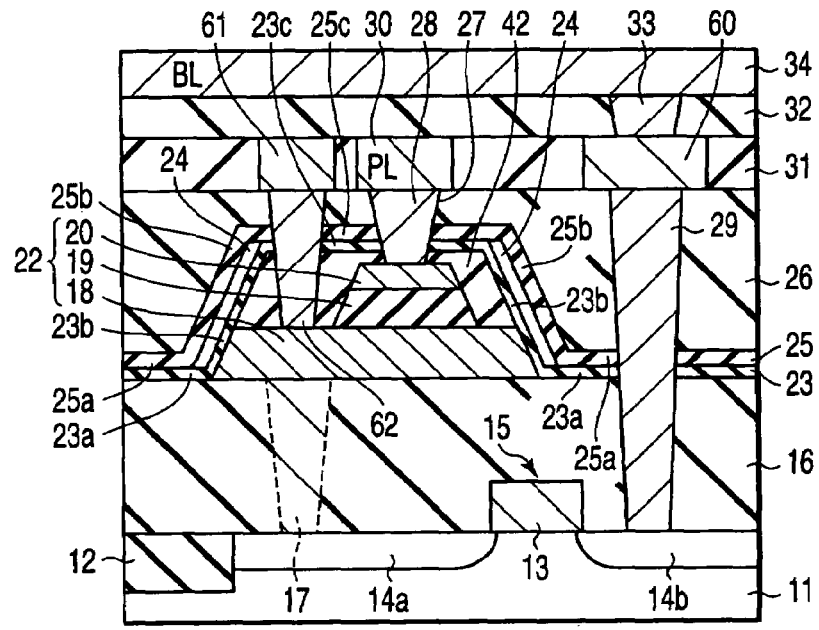
FIG. 32 is a sectional view showing the ferro-electric memory device taken along a line XXXII—XXXII in FIG. 31.

FIG. 31 is a schematic plan view of a ferro-electric memory device according to the third basic example of the third embodiment of the present invention. FIG. 32 is a sectional view of the ferro-electric memory device taken along a line XXXII—XXXII in FIG. 31. The structure according to the third basic example of the third embodiment will be described below.

As shown in FIGS. 31 and 32, the third basic example of the third embodiment is different from the second basic example of the second embodiment in the connection method between a lower electrode 18 of the ferro-electric capacitor 22 and a source/drain diffusion layer 14a.

In the second basic example of the second embodiment, the contact 17 is arranged immediately under the ferro-electric capacitor 22. In the third basic example of the third embodiment, a contact 17 is arranged not immediately under the ferro-electric capacitor 22 but in a region except the region under the lower electrode. The lower electrode 18 runs parallel to the running direction of a bit line 34. The lower electrode 18 is connected to the source/drain diffusion layer 14a in a region where neither an upper electrode 20 nor a ferro-electric film 19 is present.

This structure will be described in more detail. The lower electrode 18 has a planar size larger than those of the ferro-electric film 19 and upper electrode 20. For this reason, the lower electrode 18 has a first region where the ferro-electric film 19 and upper electrode 20 are present and a second region where the ferro-electric film 19 and upper electrode 20 are not present. A contact 62 is formed on the lower electrode 18 in the second region. An interconnection 61 is formed on the contact 62 to be flush with a plate line 30. The interconnection 61 runs in a direction (e.g., the word line direction) perpendicular to the running direction of the bit line 34 while projecting from the lower electrode 18. In this projecting region, the interconnection 61 is connected to the source/drain diffusion layer 14a through the contact 17 and the like. In this way, the lower electrode 18 is electrically connected to the source/drain diffusion layer 14a through the contacts 62 and 17 and the interconnection 61.

According to the third basic example to the third embodiment, the same effect as in the second basic example of the second embodiment can be obtained.

In addition, in the third basic example, since no oxygen preventing capability is required of the lower electrode 18, the number of steps difference needed to form the ferro-electric capacitor 22 can be reduced.

[3-2] First Modification

In the first modification to the third embodiment, a contact 29 near the ferro-electric capacitor in the third basic example is formed from a plurality of contacts.

Figure 33:
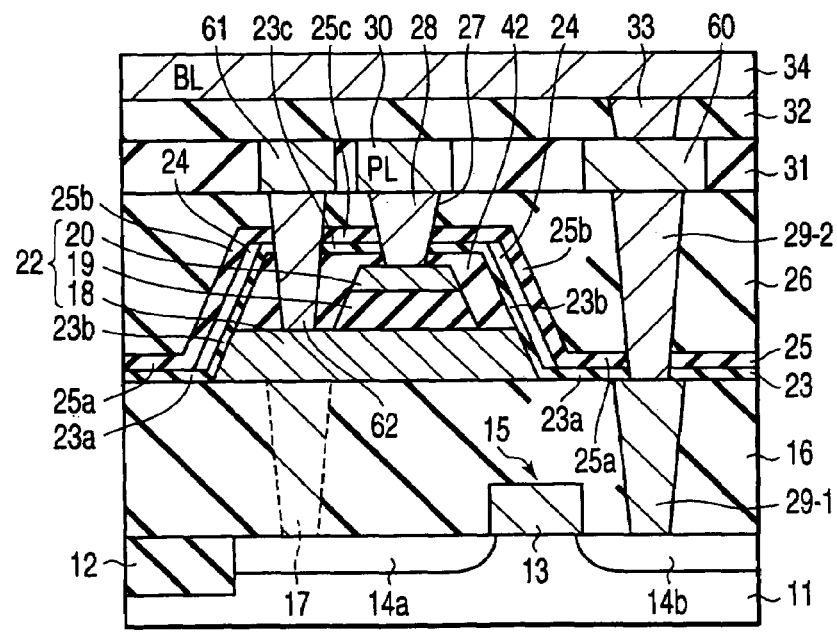
FIG. 33 is a sectional view showing a ferro-electric memory device according to the first modification to the third embodiment of the present invention.

FIG. 33 is a sectional view of a ferro-electric memory device according to the first modification to the third embodiment of the present invention. The structure according to the first modification to the third embodiment will be described below.

As shown in FIG. 33, the first modification to the third embodiment is different from the third basic example in that the contact located near the ferro-electric capacitor 22 is formed from, e.g., two contacts 29-1 and 29-2. The contact 29-1 is formed simultaneously with the contact 17. The contact 29-2 is formed after formation of a contact 28.

According to the first modification to the third embodiment, the same effect as in the third basic example can be obtained. In addition, formation and filling of the contacts 29-1 and 29-2 are easier than in the third basic example.

[3—3] Second Modification

In the second modification to the third embodiment, the first contact portion in the third basic example is modified.

Figure 34:
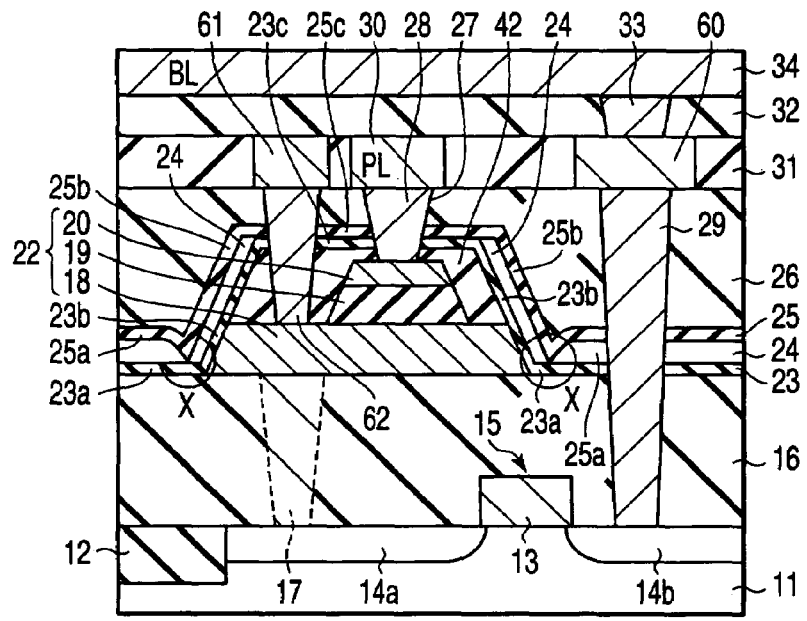
FIG. 34 is a sectional view showing a ferro-electric memory device according to the second modification to the third embodiment of the present invention.

FIG. 34 is a sectional view of a ferro-electric memory device according to the second modification to the third embodiment of the present invention. The structure according to the second modification to the third embodiment will be described below.

As shown in FIG. 34, the second modification to the third embodiment is different from the third basic example in that the first contact portion where a first portion 23a of a first hydrogen barrier film 23 and a fourth portion 25a of a second hydrogen barrier film 25 come into contact with each other has a smaller area.

That is, instead of bringing the first portion 23a and fourth portion 25a into contact with each other all over the surfaces, as in the third basic example, only a boundary portion X between the fourth portion 25a and a fifth portion 25b of the second hydrogen barrier film 25 comes into contact with the first portion 23a of the first hydrogen barrier film 23 at the lower edge portion of the lower electrode 18. An interlayer 24 is present between the first portion 23a and the fourth portion 25a.

According to the second modification to the third embodiment, the same effect as in the third basic example can be obtained.

In the second modification, the interlayer 24 made of the same material as that between a second portion 23b and the fifth portion 25b is formed between the first portion 23a and the fourth portion 25a. Hence, when the interlayer 24 is formed from a low-stress insulating film, stress on the hydrogen barrier films can be relaxed even at the first portion 23a and fourth portion 25a. For this reason, any defect formation due to breaks in the hydrogen barrier film can be suppressed.

Figure 35:
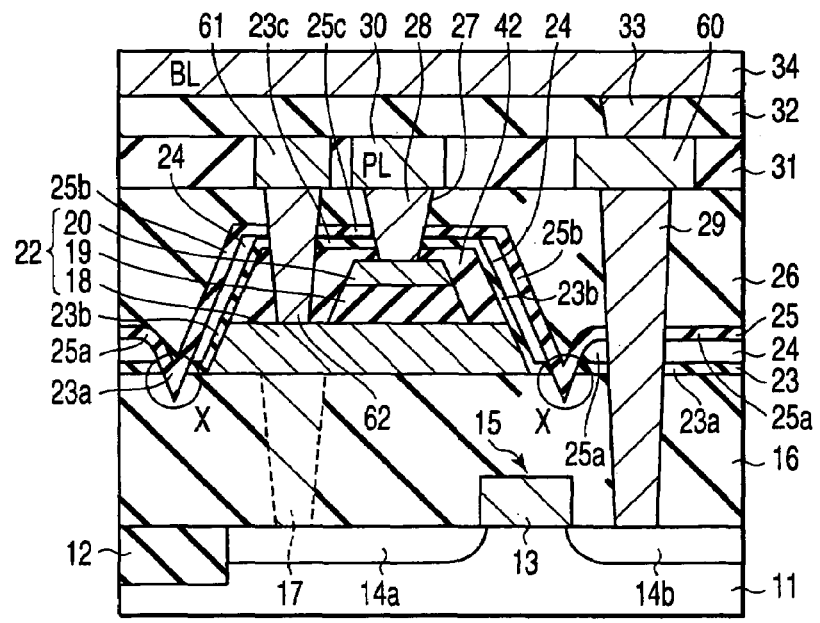
FIG. 35 is a sectional view showing another ferro-electric memory device according to the second modification to the third embodiment of the present invention.

As shown in FIG. 35, at the boundary portion X between the fourth portion 25a and the fifth portion 25b, the second hydrogen barrier film 25 may penetrate the first hydrogen barrier film 23 and reach the interlayer dielectric film 16 under it.

[3-4] Third Modification

In the third modification to the third embodiment, the second contact portion in the third basic example is not present.

Figure 36:
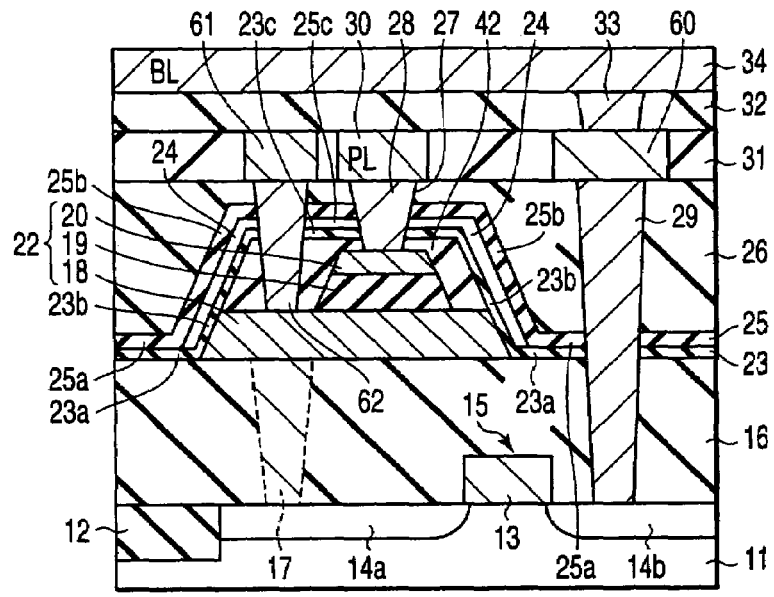
FIG. 36 is a sectional view showing a ferro-electric memory device according to the third modification to the third embodiment of the present invention.

FIG. 36 is a sectional view of a ferro-electric memory device according to the third modification to the third embodiment of the present invention. The structure according to the third modification to the third embodiment will be described below.

As shown in FIG. 36, the third modification to the third embodiment is different from the third basic example in that the first hydrogen barrier film 23 and second hydrogen barrier film 25 do not come into contact with each other above the upper electrode 20. That is, the interlayer 24 is present between a third portion 23c of the first hydrogen barrier film 23 and a sixth portion 25c of the second hydrogen barrier film 25.

According to the third modification to the third embodiment, the same effect as in the third basic example can be obtained.

In the third modification, the interlayer 24 is present between the second portion 23b and the fifth portion 25b and between the third portion 23c and the sixth portion 25c, which cover the ferro-electric capacitor 22. For this reason, the influence of stress of the second hydrogen barrier film 25 on the ferro-electric capacitor 22 can be reduced.

[3-5] Fourth Modification

In the fourth modification to the third embodiment, the position of the bit line in the third basic example is changed.

Figure 37:
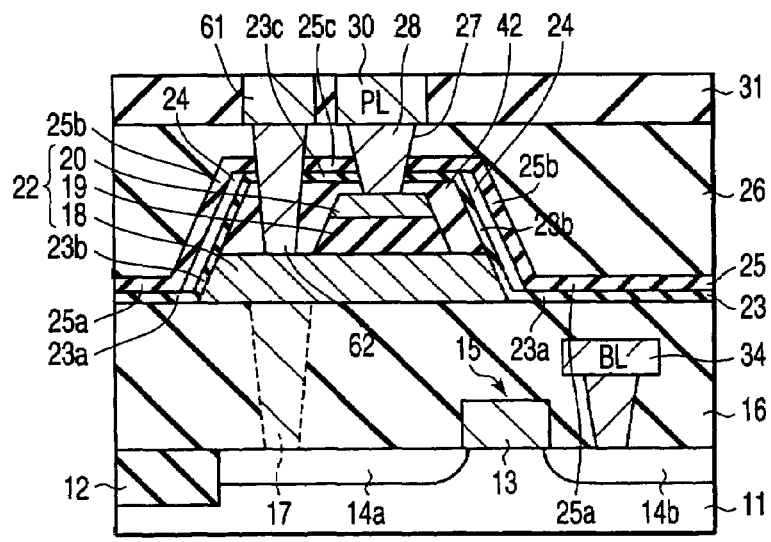
FIG. 37 is a sectional view showing a ferro-electric memory device according to the fourth modification to the third embodiment of the present invention.

FIG. 37 is a sectional view of a ferro-electric memory device according to the fourth modification to the third embodiment of the present invention. The structure according to the fourth modification to the third embodiment will be described below.

As shown in FIG. 37, the fourth modification to the third embodiment is different from the third basic example in that the bit line 34 is arranged under the ferro-electric capacitor 22. That is, the bit line 34 is formed in the interlayer dielectric film 16 under the ferro-electric capacitor 22 and connected to a source/drain diffusion layer 14b through a contact.

According to the fourth modification to the third embodiment, the same effect as in the third basic example can be obtained.

C. TC Parallel Unit Series-Connected Type

Ferro-electric memory devices according to the fourth and fifth embodiments are examples of TC parallel unit series-connected type memory cells. In a TC parallel unit series-connected type memory cell, the two terminals of a capacitor (C) are connected between the source and the drain of a memory cell transistor (T) to form a unit cell, and a plurality of unit cells are connected in series.

[4] Fourth Embodiment

The fourth embodiment is a TC parallel unit series-connected type memory cell, in which the upper electrode, ferro-electric film, and lower electrode in a ferro-electric capacitor are processed by using one mask.

[4-1] Fourth Basic Example

Figure 38:
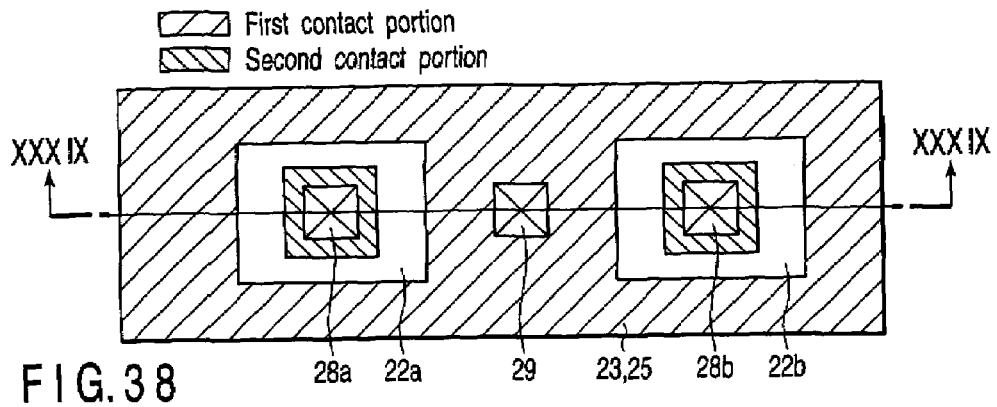
FIG. 38 is a schematic plan view showing a ferro-electric memory device according to the fourth basic example of the fourth embodiment of the present invention.
Figure 39:
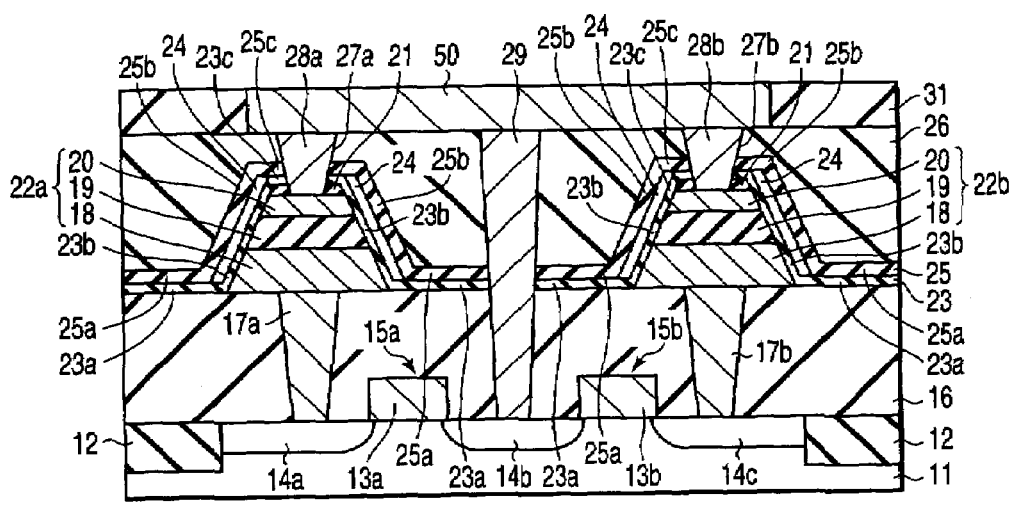
FIG. 39 is a sectional view showing the ferro-electric memory device taken along a line XXXIX—XXXIX in FIG. 38.

FIG. 38 is a schematic plan view of a ferro-electric memory device according to the fourth basic example of the fourth embodiment of the present invention. FIG. 39 is a sectional view of the ferro-electric memory device taken along a line XXXIX—XXXIX in FIG. 38. The structure according to the fourth basic example of the fourth embodiment will be described below.

As shown in FIGS. 38 and 39, the fourth basic example of the fourth embodiment is different from the first basic example of the first embodiment in that the memory cell has a TC parallel unit series-connected type cell structure. More specifically, the fourth basic example has the following structure.

The first cell includes a MOSFET 15a and a ferro-electric capacitor 22a. In the first cell, a lower electrode 18 of the ferro-electric capacitor 22a is electrically connected to a source/drain diffuse layer 14a. An upper electrode 20 of the ferro-electric capacitor 22a is electrically connected to a source/drain diffusion layer 14b through a contact 29 and an interconnection 50. Accordingly, the source/drain diffusion layers 14a and 14b of the MOSFET 15a and the upper electrode 20 and lower electrode 18 of the ferro-electric capacitor 22a are connected in parallel.

The second cell includes a MOSFET 15b and a ferro-electric capacitor 22b. In the second cell, the lower electrode 18 of the ferro-electric capacitor 22b is electrically connected to a source/drain diffuse layer 14c. The upper electrode 20 of the ferro-electric capacitor 22b is electrically connected to the source/drain diffusion layer 14b through the contact 29 and interconnection 50. Accordingly, the source/drain diffusion layers 14b and 14c of the MOSFET 15b and the upper electrode 20 and lower electrode 18 of the ferro-electric capacitor 22b are connected in parallel.

The first and second cells share the connection portion between the source/drain diffusion layer 14b and the upper electrode 20. Hence, the first and second cells are connected in series to form one block.

The number of cells of one block is not limited to two. One block may be formed by connecting a plurality of cells in series. Although not illustrated, a block select transistor to select a block is arranged at the end portion of the block. One of the source and drain of the block select transistor is connected to the block, and the other is connected to a bit line.

According to the fourth basic example of the fourth embodiment, the same effect as in the second basic example of the second embodiment can be obtained.

Additionally, in the fourth basic example, since the number of memory cells connected to the bit line in an active state decreases, the parasitic capacitance of the bit line decreases, and the signal amount becomes large. For this reason, the signal increase amount that can be obtained by the damage preventing effect can be increased.

[4-2] First Modification

In the first modification to the fourth embodiment, the contact 29 near the ferro-electric capacitor in the fourth basic example is formed from a plurality of contacts.

Figure 40:
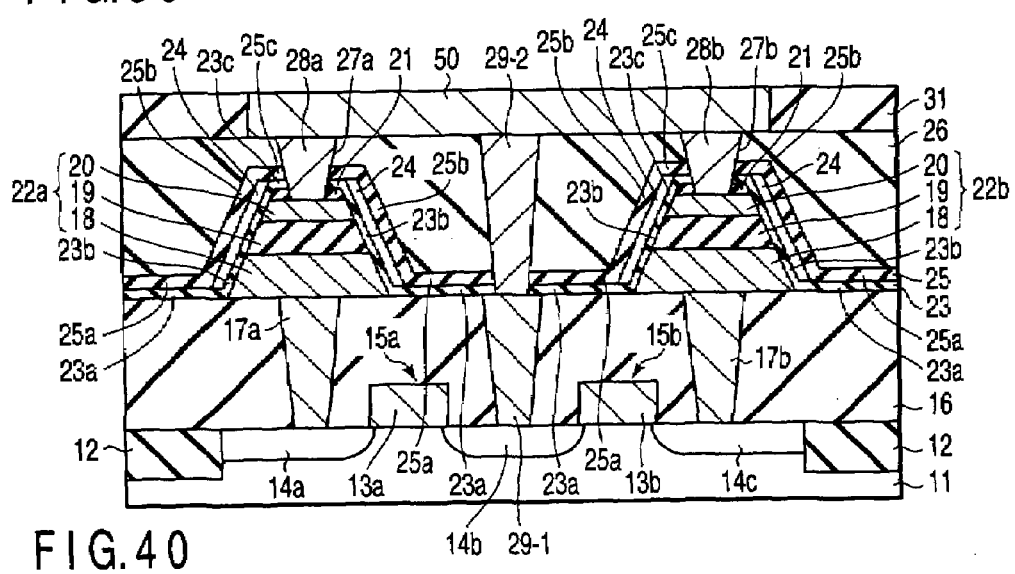
FIG. 40 is a sectional view showing a ferro-electric memory device according to the first modification to the fourth embodiment of the present invention.

FIG. 40 is a sectional view of a ferro-electric memory device according to the first modification to the fourth embodiment of the present invention. The structure according to the first modification to the fourth embodiment will be described below.

As shown in FIG. 40, the first modification to the fourth embodiment is different from the fourth basic example in that the contact located near the ferro-electric capacitors 22a and 22b is formed from, e.g., two contacts 29-1 and 29-2. The contact 29-1 is formed simultaneously with a contact 17. The contact 29-2 is formed after formation of a contact 28.

According to the first modification to the fourth embodiment, the same effect as in the fourth basic example can be obtained. In addition, formation and filling of the contacts 29-1 and 29-2 are easier than in the fourth basic example.

[4-3] Second Modification

In the second modification to the fourth embodiment, the first contact portion in the fourth basic example is modified.

FIG. 41 is a sectional view of a ferro-electric memory device according to the second modification to the fourth embodiment of the present invention. The structure according to the second modification to the fourth embodiment will be described below.

As shown in FIG. 41, the second modification to the fourth embodiment is different from the fourth basic example in that the first contact portion where a first portion 23a of a first hydrogen barrier film 23 and a fourth portion 25a of a second hydrogen barrier film 25 come into contact with each other has a smaller area.

That is, instead of bringing the first portion 23a and fourth portion 25a into contact with each other all over the surfaces, as in the fourth basic example, only a boundary portion X between the fourth portion 25a and a fifth portion 25b of the second hydrogen barrier film 25 comes into contact with the first portion 23a of the first hydrogen barrier film 23 at the lower edge portion of the lower electrode 18. An interlayer 24 is present between the first portion 23a and the fourth portion 25a.

According to the second modification to the fourth embodiment, the same effect as in the fourth basic example can be obtained.

In the second modification, the interlayer 24 made of the same material as that between a second portion 23b and the fifth portion 25b is formed between the first portion 23a and the fourth portion 25a. Hence, when the interlayer 24 is formed from a low-stress insulating film, stress on the hydrogen barrier films can be relaxed even at the first portion 23a and fourth portion 25a. For this reason, any defect formation due to breaks in the hydrogen barrier film can be suppressed.

As shown in FIG. 42, at the boundary portion X between the fourth portion 25a and the fifth portion 25b, the second hydrogen barrier film 25 may penetrate the first hydrogen barrier film 23 and reach an interlayer dielectric film 16 under it.

[4—4] Third Modification

In the third modification to the fourth embodiment, the second contact portion in the fourth basic example is not present.

Figure 43:
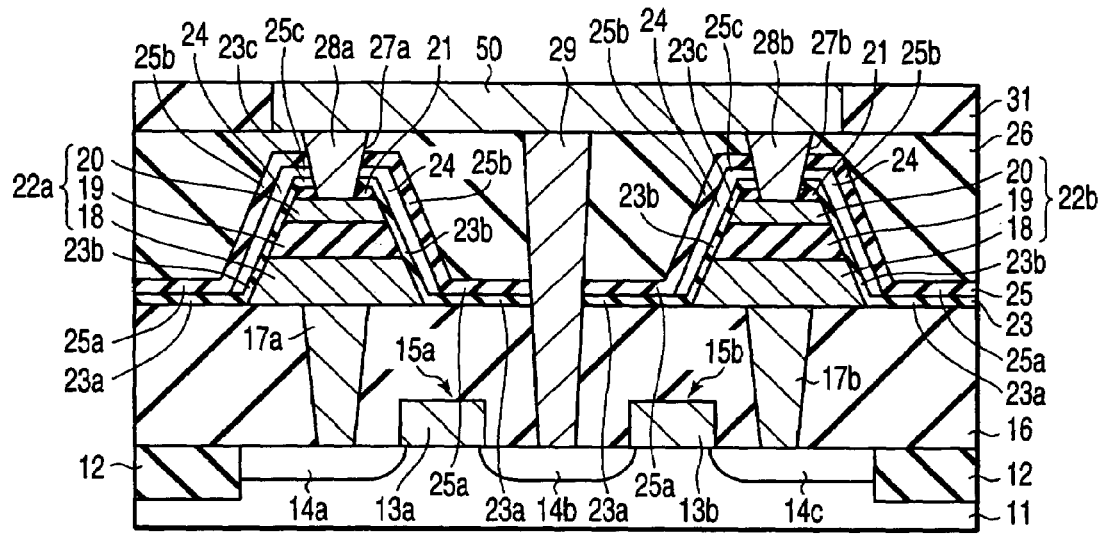
FIG. 43 is a sectional view showing a ferro-electric memory device according to the third modification to the fourth embodiment of the present invention.

FIG. 43 is a sectional view of a ferro-electric memory device according to the third modification to the fourth embodiment of the present invention. The structure according to the third modification to the fourth embodiment will be described below.

As shown in FIG. 43, the third modification to the fourth embodiment is different from the fourth basic example in that the first hydrogen barrier film 23 and second hydrogen barrier film 25 do not come into contact with each other above the upper electrode 20. That is, the interlayer 24 is present between a third portion 23c of the first hydrogen barrier film 23 and a sixth portion 25c of the second hydrogen barrier film 25.

According to the third modification to the fourth embodiment, the same effect as in the fourth basic example can be obtained.

In the third modification, the interlayer 24 is present between the second portion 23b and the fifth portion 25b and between the third portion 23c and the sixth portion 25c, which cover the ferro-electric capacitor 22. For this reason, the influence of stress of the second hydrogen barrier film 25 on the ferro-electric capacitor 22 can be reduced.

[5] Fifth Embodiment

The fifth embodiment is a TC parallel unit series-connected type memory cell, in which the upper electrode, ferro-electric film, and lower electrode in a ferro-electric capacitor are processed by using two masks.

[5-1] Fifth Basic Example

Figure 44:
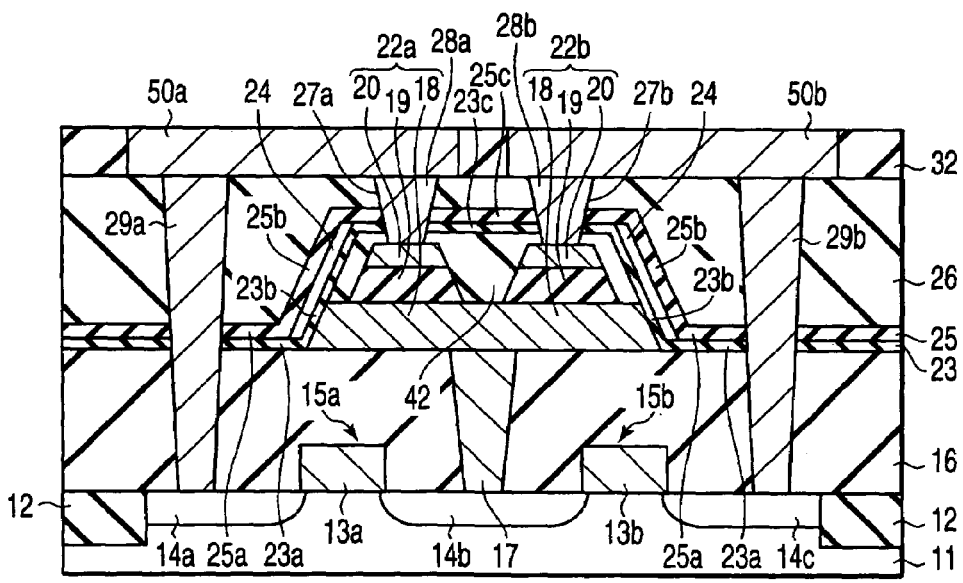
FIG. 44 is a sectional view showing a ferro-electric memory device according to the fifth basic example of the fifth embodiment of the present invention.

FIG. 44 is a sectional view of a ferro-electric memory device according to the fifth basic example of the fifth embodiment of the present invention. The structure according to the fifth basic example of the fifth embodiment will be described below.

As shown in FIG. 44, the fifth basic example of the fifth embodiment is different from the fourth basic example of the fourth embodiment in the structure of ferro-electric capacitors 22a and 22b. In the fourth basic example, each of the ferro-electric capacitors 22a and 22b is formed by using one mask. In the fifth basic example, each of the ferro-electric capacitors 22a and 22b is formed by using two masks. In the fifth basic example, since a ferro-electric film 19 and upper electrode 20 are formed by using a mask different from that used for a lower electrode 18, the ferro-electric film 19 and upper electrode 20 have a planar shape different from that of the lower electrode 18.

More specifically, the lower electrode 18 has a larger planar size than the ferro-electric film 19 and upper electrode 20. The side surface of the ferro-electric film 19 is almost flush with that of the upper electrode 20. The planar size of the ferro-electric film 19 is larger than or almost equal to that of the upper electrode 20.

According to the fifth basic example to the fifth embodiment, the same effect as in the fourth basic example of the fourth embodiment can be obtained. In addition, the risk to short-circuit the upper electrode 20 and lower electrode 18 can be suppressed as compared to the fourth basic example.

[5-2] First Modification

In the first modification to the fifth embodiment, a contact 29 near the ferro-electric capacitor in the fifth basic example is formed from a plurality of contacts.

Figure 45:
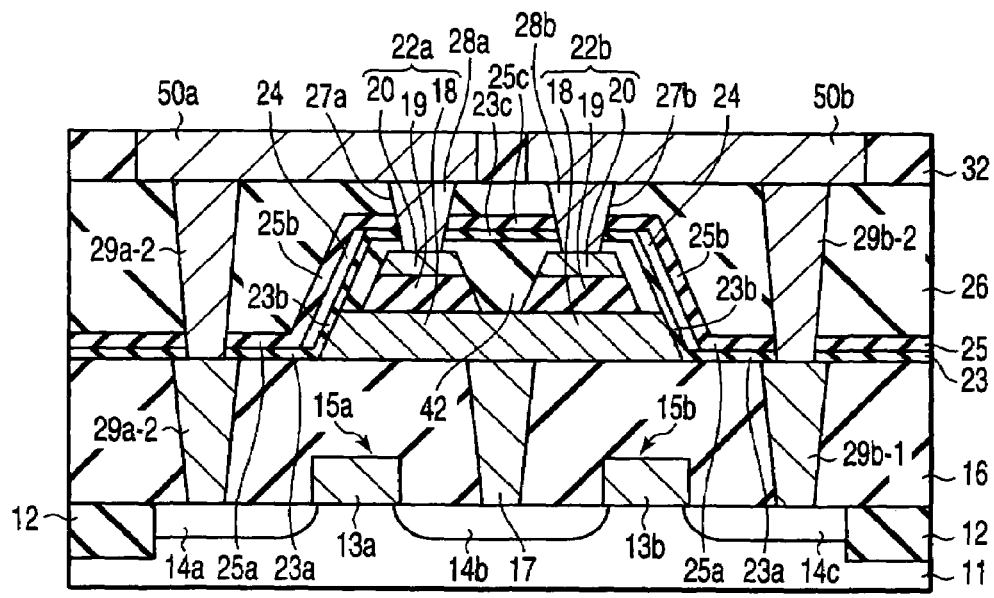
FIG. 45 is a sectional view showing a ferro-electric memory device according to the first modification to the fifth embodiment of the present invention.

FIG. 45 is a sectional view of a ferro-electric memory device according to the first modification to the fifth embodiment of the present invention. The structure according to the first modification to the fifth embodiment will be described below.

As shown in FIG. 45, the first modification to the fifth embodiment is different from the fifth basic example in that the contact located near the ferro-electric capacitor 22a is formed from two contacts 29a-1 and 29a-2, and the contact located near the ferro-electric capacitor 22b is formed from two contacts 29b-1 and 29b-2. The contacts 29a-1 and 29b-1 are formed simultaneously with a contact 17. The contacts 29a-2 and 29b-2 are formed after formation of contacts 28a and 28b.

According to the first modification to the fifth embodiment, the same effect as in the fifth basic example can be obtained. In addition, formation and filling of the contacts 29a-1, 29a-2, 29b-1, and 29b-2 are easier than in the fifth basic example.

[5-3] Second Modification

In the second modification to the fifth embodiment, the first contact portion in the fifth basic example is modified.

Figure 46:
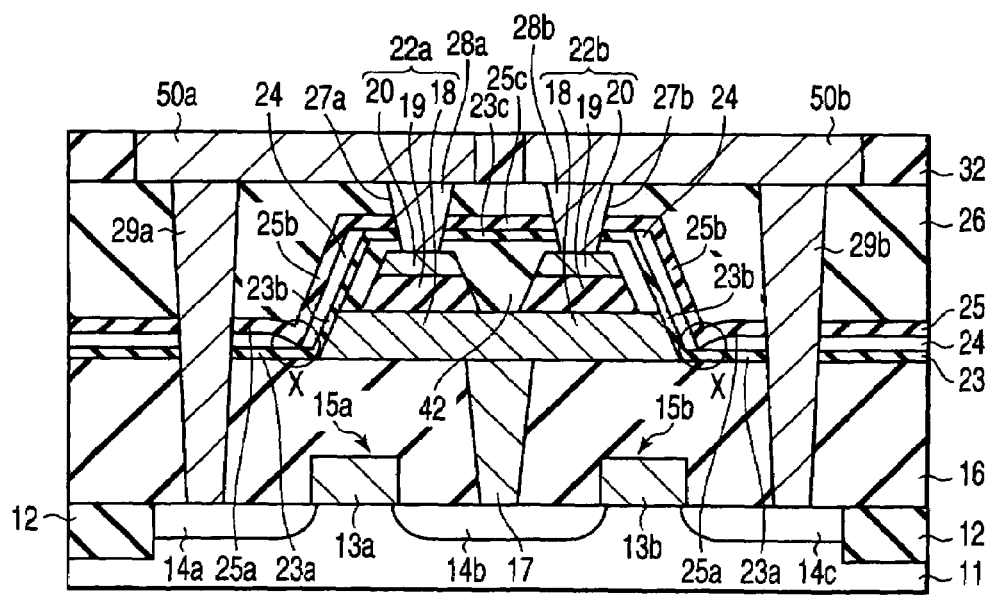
FIG. 46 is a sectional view showing a ferro-electric memory device according to the second modification to the fifth embodiment of the present invention.

FIG. 46 is a sectional view of a ferro-electric memory device according to the second modification to the fifth embodiment of the present invention. The structure according to the second modification to the fifth embodiment will be described below.

As shown in FIG. 46, the second modification to the fifth embodiment is different from the fifth basic example in that the first contact portion where a first portion 23a of a first hydrogen barrier film 23 and a fourth portion 25a of a second hydrogen barrier film 25 come into contact with each other has a smaller area.

That is, instead of bringing the first portion 23a and fourth portion 25a into contact with each other all over the surfaces, as in the fifth basic example, only a boundary portion X between the fourth portion 25a and a fifth portion 25b of the second hydrogen barrier film 25 comes into contact with the first portion 23a of the first hydrogen barrier film 23 at the lower edge portion of the lower electrode 18. An interlayer 24 is present between the first portion 23a and the fourth portion 25a.

According to the second modification to the fifth embodiment, the same effect as in the fifth basic example can be obtained.

In the second modification, the interlayer 24 made of the same material as that between a second portion 23b and the fifth portion 25b is inserted between the first portion 23a and the fourth portion 25a. Hence, when the interlayer 24 is formed from a low-stress insulating film, stress on the hydrogen barrier films can be relaxed even at the first portion 23a and fourth portion 25a. For this reason, any defect formation due to breaks in the hydrogen barrier film can be suppressed.

Figure 47:
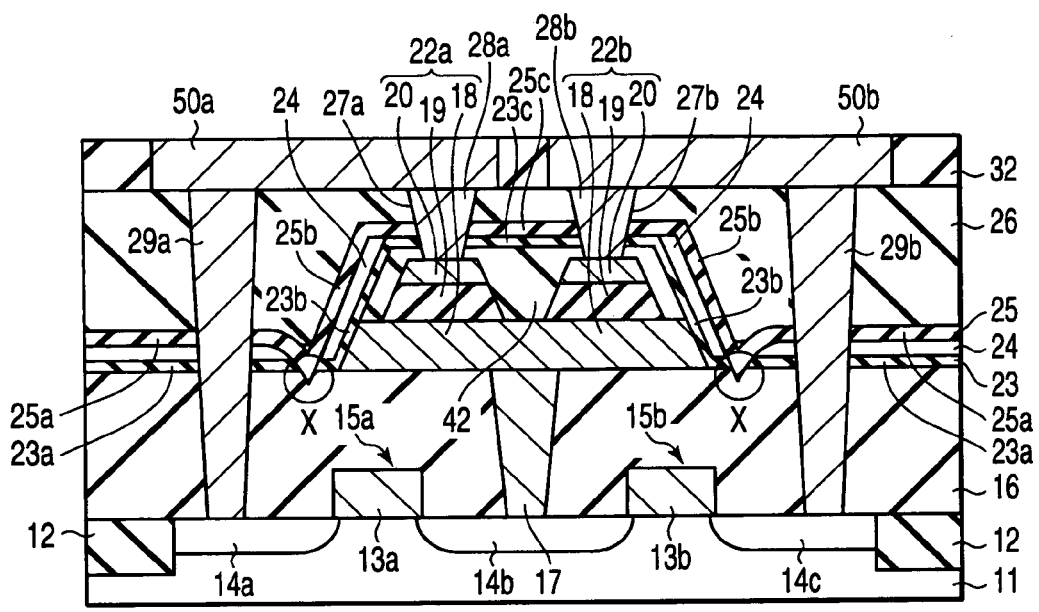
FIG. 47 is a sectional view showing another ferro-electric memory device according to the second modification to the fifth embodiment of the present invention.

As shown in FIG. 47, at the boundary portion X between the fourth portion 25a and the fifth portion 25b, the second hydrogen barrier film 25 may penetrate the first hydrogen barrier film 23 and reach an interlayer dielectric film 16 under it.

[5-4] Third Modification

In the third modification to the fifth embodiment, the second contact portion in the fifth basic example is not present.

Figure 48:
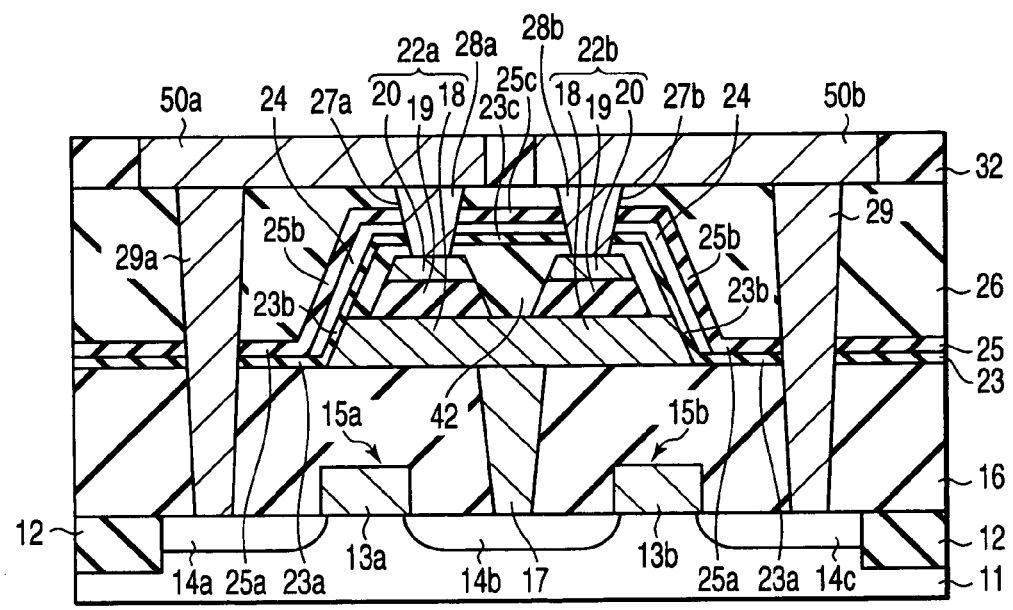
FIG. 48 is a sectional view showing a ferro-electric memory device according to the third modification to the fifth embodiment of the present invention.

FIG. 48 is a sectional view of a ferro-electric memory device according to the third modification to the fifth embodiment of the present invention. The structure according to the third modification to the fifth embodiment will be described below.

As shown in FIG. 48, the third modification to the fifth embodiment is different from the fifth basic example in that the first hydrogen barrier film 23 and second hydrogen barrier film 25 do not come into contact with each other above the upper electrode 20. That is, the interlayer 24 is present between a third portion 23c of the first hydrogen barrier film 23 and a sixth portion 25c of the second hydrogen barrier film 25.

According to the third modification to the fifth embodiment, the same effect as in the fifth basic example can be obtained.

In the third modification, the interlayer 24 is present between the second portion 23b and the fifth portion 25b and between the third portion 23c and the sixth portion 25c, which cover the ferro-electric capacitor 22. For this reason, the affect of stress of the second hydrogen barrier film 25 on the ferro-electric capacitor 22 can be reduced.

The present invention is not limited to the above embodiments, and various changes and modifications can be made within the spirit and scope of the present invention. For example, as shown in FIG. 49, the first portion 23a of the first hydrogen barrier film 23 may be located on the lower side of the lower edge portion of the lower electrode 18. The structure shown in FIG. 49 is implemented when, e.g., over-etching occurs in processing the ferro-electric capacitor 22, and the upper surface of the interlayer dielectric film 16 is etched.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferro-electric memory device comprising:
   a semiconductor substrate;
   a first transistor which is formed on the semiconductor substrate and has a first gate electrode, a first diffusion layer, and a second diffusion layer;
   a first insulating film which is formed on the semiconductor substrate and the first transistor;

a first ferro-electric capacitor which is selectively formed on the first insulating film and has a first lower electrode, a first ferro-electric film, and a first upper electrode;

a first hydrogen barrier film which has a first portion, a second portion, and a third portion, which are continuously formed, the first portion being formed on the first insulating film, the second portion covering a side surface of the first lower electrode, a side surface of the first ferro-electric film, and a side surface of the first upper electrode, and the third portion being formed on an upper surface of the first upper electrode;

a first interlayer which is formed on the second portion; and a second hydrogen barrier film which has a fourth portion, a fifth portion, and a sixth portion, which are continuously formed, the fourth portion having a first contact portion which comes into contact with at least part of the first portion, the fifth portion being formed on the first interlayer, and the sixth portion being formed on the third portion.

2. The device according to claim 1, further comprising a first contact which is formed under the first lower electrode and electrically connected to the first diffusion layer and the first lower electrode, a second contact which is electrically connected to the first upper electrode, a plate line which is electrically connected to the second contact, a third contact which is electrically connected to the second diffusion layer, and a bit line which is electrically connected to the third contact.

3. The device according to claim 2, wherein the first lower electrode has a larger planar size than the first ferro-electric film and the first upper electrode.

4. The device according to claim 1, in which the first lower electrode has a larger planar size than the first ferro-electric film and the first upper electrode, the first lower electrode has a first region where the first ferro-electric film and the first upper electrode are present and a second region where the first ferro-electric film and the first upper electrode are not present, and which further comprises a first contact which is arranged on the first lower electrode in the second region and electrically connected to the first lower electrode, a second contact which is electrically connected to the first diffusion layer in a region except a region under the first lower electrode, an interconnection which electrically connects the first contact to the second contact, a third contact which is electrically connected to the first upper electrode, a plate line which is electrically connected to the third contact, a fourth contact which is electrically connected to the second diffusion layer, and a bit line which is electrically connected to the fourth contact.

5. The device according to claim 1, which further comprises a second transistor which is formed on the semiconductor substrate and has a second gate electrode, a third diffusion layer, and a fourth diffusion layer which continues to the second diffusion layer, a second ferro-electric capacitor which is selectively formed on the first insulating film and has a second lower electrode, a second ferro-electric film, and a second upper electrode, a third hydrogen barrier film which has a seventh portion, an eighth portion, and a ninth portion, which are continuously formed, the seventh portion being formed on the first insulating film, the eighth portion covering a side surface of the second lower electrode, a side surface of the second ferro-electric film, and a side surface of the second upper electrode, and the ninth portion being formed on an upper surface of the second upper electrode, a second interlayer which is formed on the eighth portion, and a fourth hydrogen barrier film which has a 10th portion, an 11th portion, and a 12th portion, which are continuously formed, the 10th portion having a second contact portion which comes into contact with at least part of the seventh portion, the 11th portion being formed on the second interlayer, and the 12th portion being formed on the ninth portion, and in which the first transistor and the first ferro-electric capacitor are connected in parallel, and the first transistor and the first ferro-electric capacitor form a first cell, the second transistor and the second ferro-electric capacitor are connected in parallel, and the second transistor and the second ferro-electric capacitor form a second cell, and the first cell and the second cell are connected in series.

6. The device according to claim 5, wherein the first lower electrode has a larger planar size than the first ferro-electric film and the first upper electrode, and the second lower electrode has a larger planar size than the second ferro-electric film and the second upper electrode.

7. The device according to claim 1, wherein the first contact portion surrounds the first ferro-electric capacitor.

8. The device according to claim 1, wherein the second hydrogen barrier film is thicker than the first hydrogen barrier film.

9. The device according to claim 1, wherein the first interlayer is essentially formed from a conductive material.

10. The device according to claim 1, wherein the first contact portion is present only near a lower edge portion of the first lower electrode, and a second interlayer is present between the first portion and the fourth portion except the first contact portion.

11. The device according to claim 1, wherein the second hydrogen barrier film at the first contact portion penetrates the first hydrogen barrier film.

12. The device according to claim 1, further comprising a second interlayer which is formed between the third portion and the sixth portion.

13. The device according to claim 1, wherein the first portion is located on a lower side of a lower edge portion of the first lower electrode.

* * * * *